United States Patent
Date et al.

(10) Patent No.: US 7,034,787 B2
(45) Date of Patent: Apr. 25, 2006

(54) OUTPUT CIRCUIT FOR GRAY SCALE CONTROL, TESTING APPARATUS THEREOF, AND METHOD FOR TESTING OUTPUT CIRCUIT FOR GRAY SCALE CONTROL

(75) Inventors: Yoshito Date, Shiga (JP); Atsuhiro Yamano, Hyogo (JP); Hitoshi Tsuge, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 330 days.

(21) Appl. No.: 10/394,032

(22) Filed: Mar. 24, 2003

(65) Prior Publication Data

US 2003/0184568 A1    Oct. 2, 2003

(30) Foreign Application Priority Data

Mar. 27, 2002    (JP)    .............................. 2002-087642

(51) Int. Cl.
G09G 3/36    (2006.01)

(52) U.S. Cl. ........................................ 345/89; 345/589

(58) Field of Classification Search .................. 345/87, 345/88, 89, 90, 91, 92, 98, 99, 100, 204, 345/83, 84, 589, 591, 596, 597, 600, 605
See application file for complete search history.

(56) References Cited

U.S. PATENT DOCUMENTS 6,535,189 B1 *    3/2003    Akiyama et al. ............. 345/87
2002/0093475 A1 *    7/2002    Hashimoto ................... 345/87

* cited by examiner

*Primary Examiner*—Vijay Shankar
*Assistant Examiner*—Nitin Patel
(74) *Attorney, Agent, or Firm*—McDermott Will & Emery LLP

(57) ABSTRACT

An output circuit for gray scale control includes a low-side current mirror unit, a low-side gray scale control circuit, a high-side current mirror unit, a high-side gray scale control circuit, a current increment control circuit and a selective precharge control circuit. A gray scale control circuit for outputting gray scale signals is separated into the high side and the low side, thereby enabling the output-current characteristics to be controlled to be close to the γ characteristics of a light emitting device. In addition, variations in the current for each output unit can be suppressed by using multistage current mirrors.

7 Claims, 26 Drawing Sheets

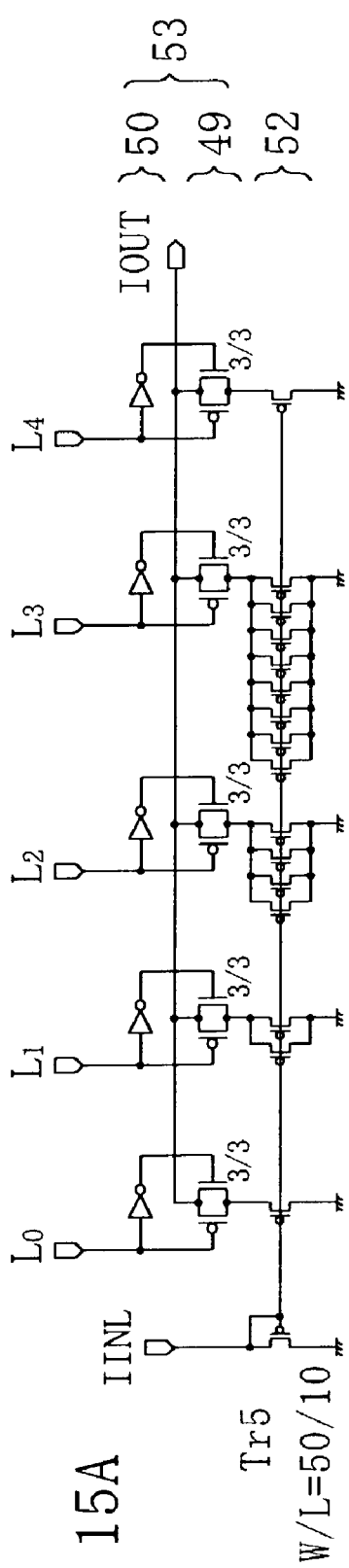
FIG. 15A
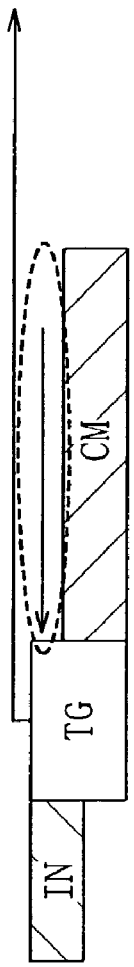
FIG. 15B
FIG. 15C

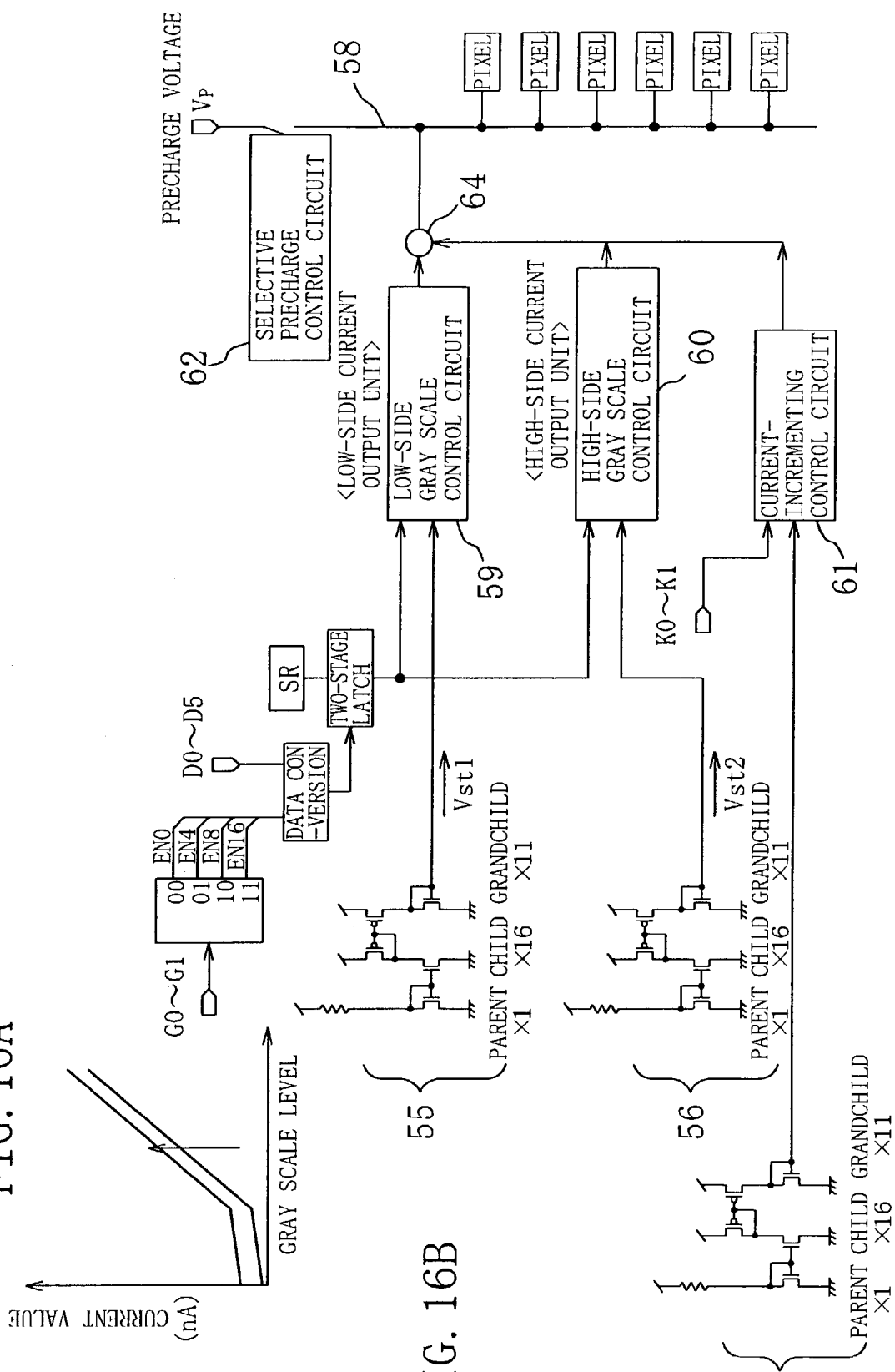

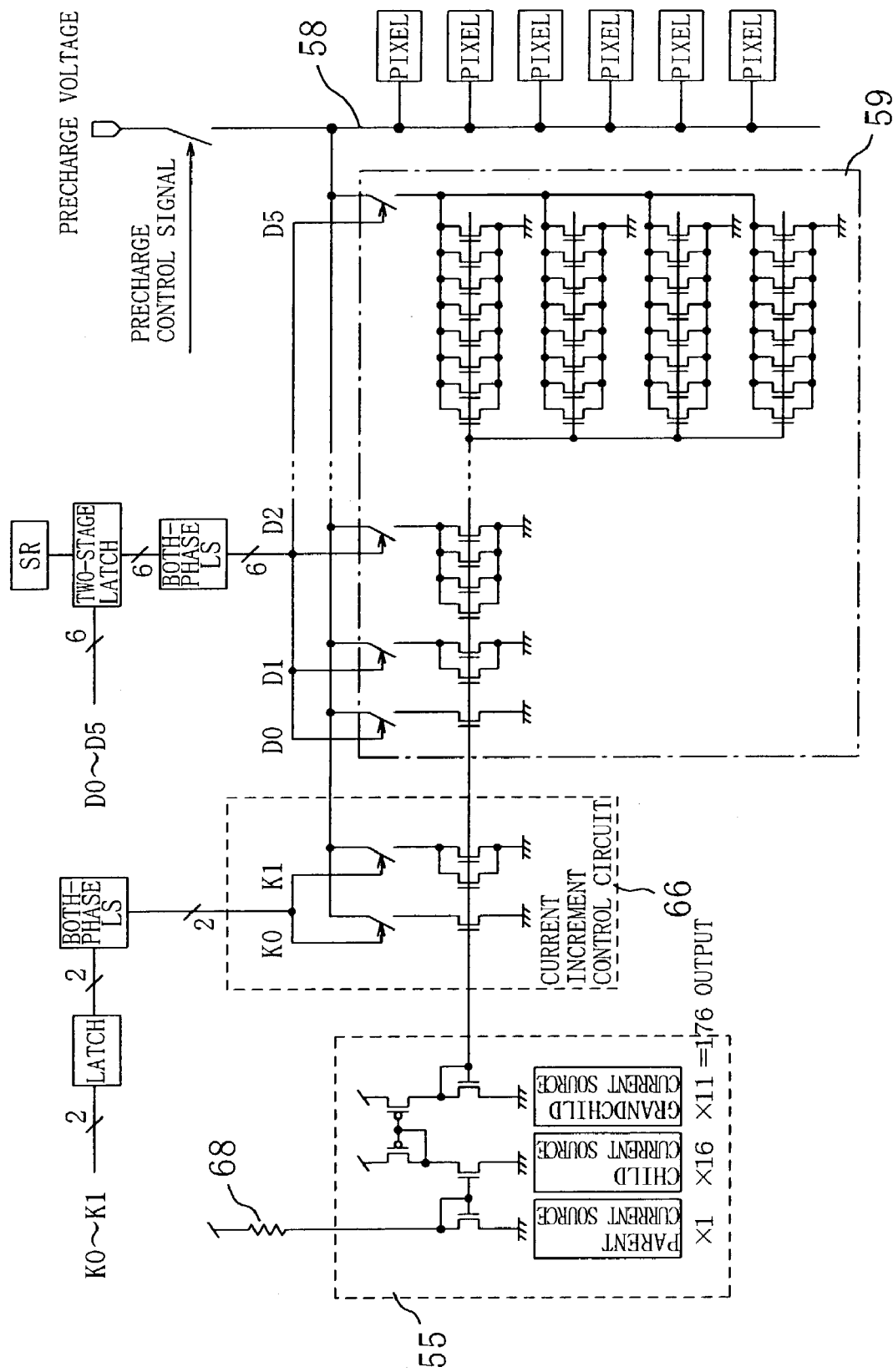

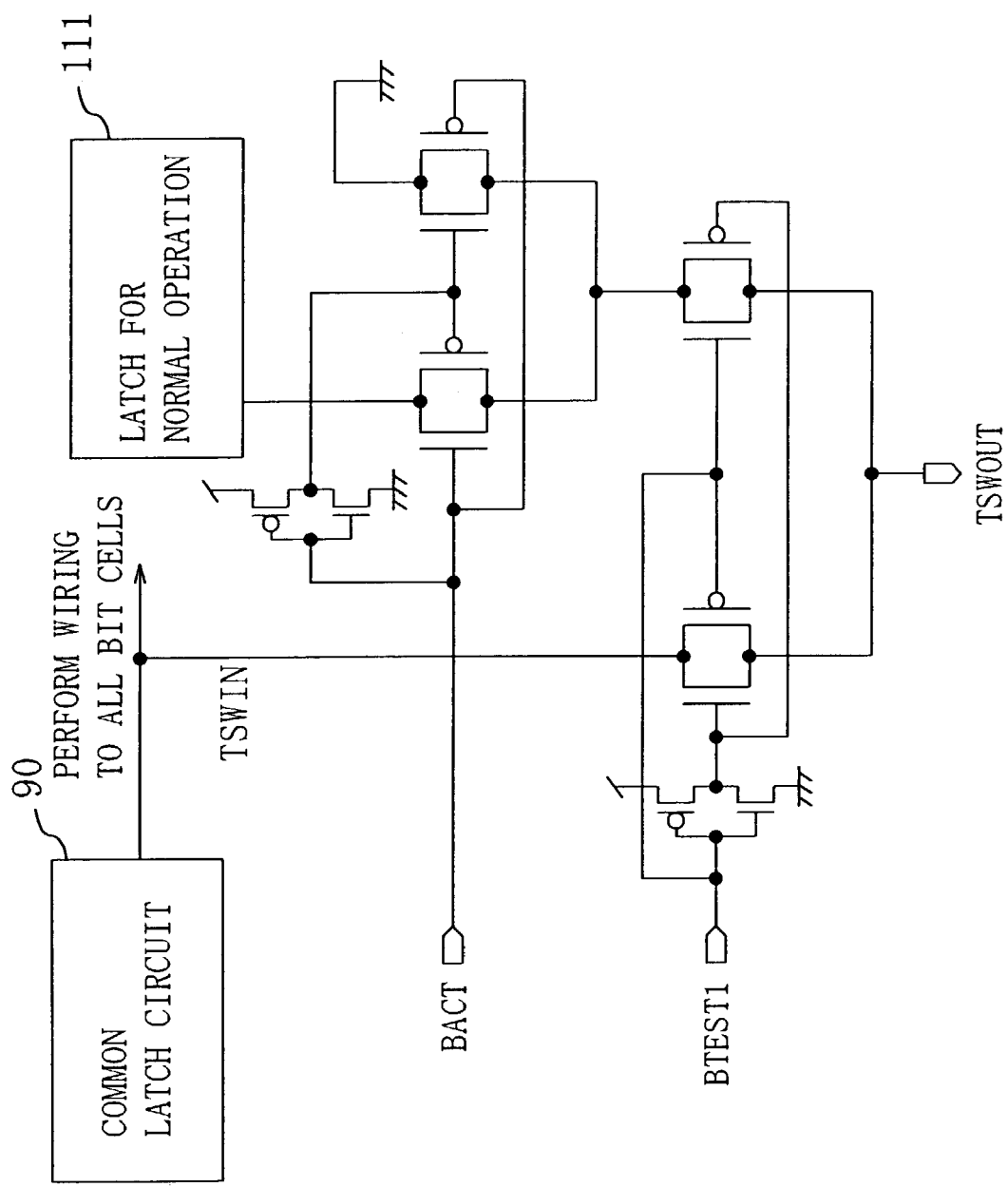

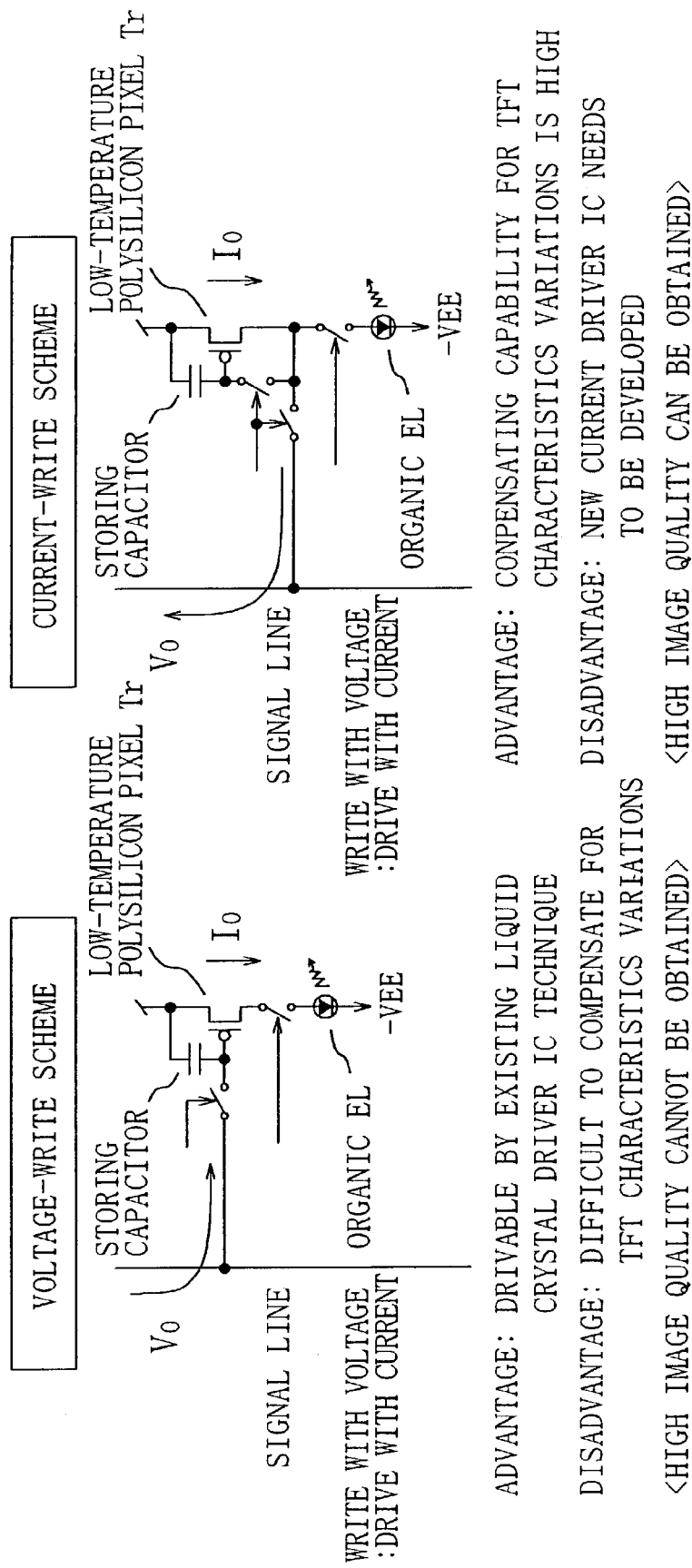

US 7,034,787 B2

OUTPUT CIRCUIT FOR GRAY SCALE CONTROL, TESTING APPARATUS THEREOF, AND METHOD FOR TESTING OUTPUT CIRCUIT FOR GRAY SCALE CONTROL

BACKGROUND OF THE INVENTION

The present invention relates to an output circuit for gray scale control which is used for a display apparatus and an output apparatus, and more particularly to a driver IC for performing gray scale control in accordance with an electrical current or voltage, a testing apparatus thereof, and a method for testing the driver IC.

In general, an active matrix type image display apparatus includes a large number of pixels arranged in a matrix, and controls light intensity for each pixel in accordance with given luminance information to display images. Therefore, a display panel having, for example, a rectangular shape has TFTs (Thin-Film-Transistors) which are arranged in a matrix and control a state of a liquid crystal or optical substance, a data line driving circuit provided along upper and lower sides of the panel, and a gate line driving circuit provided at the side end of the panel.

Conventionally, image display apparatuses such as display panels, using liquid crystal as an optical substance, have been mainstream. In these image display apparatuses, a liquid crystal driving circuit (liquid crystal driver) supplies display information in the form of a voltage to each pixel, and changes transmittances of the pixels in accordance with the display information.

In comparison, in recent years, proposals have been frequently made for image display apparatuses using an organic EL (Electro Luminescence) material as light emitting devices. Dissimilar to liquid crystal, since the organic EL material itself emits light, a display panel using it offers advantages in that visibility is improved and no backlight is necessary. The organic EL material used in the display panel has a function of serving as a diode and emits in reaction to electric current. Two driving schemes are employed for the organic EL panels.

FIG. 24 is a diagram for describing the driving schemes for the organic EL panel.

As shown in FIG. 24, a first one of the driving schemes for the organic EL panel is a voltage write scheme. In this scheme, display data is supplied in the form of voltage $V_0$ from a voltage driver to a TFT (low temperature polysilicon pixel Tr). Charges accumulated in a load such as a capacitor are charged or discharged corresponding to the voltage $V_0$, whereby a current $I_0$ is flown to an organic EL diode. However, there occurs a problem in that while the driving scheme is advantageous in that an existing liquid crystal driver IC technique can be used, voltage supply is unstable, thereby making it difficult to compensate characteristics variations of a low temperature polysilicon TFT.

The second one of the driving schemes for the organic EL panel is a current write scheme. In this scheme, gray scale display is controlled by changing the amount of current from the panel. The TFTs made of the low temperature polysilicon on the panel constitute current mirrors, to which a current equal to a current $I_0$ taken out from the panel to a signal line is flown. According to this scheme, it is possible to compensate TFT characteristics variations, and realize an organic EL panel with high image quality.

In an organic EL panel capable of performing a color display, pixels of three colors R (red), green (G) and B (blue) are arranged. In the case of the current write scheme, the pixel luminance is varied in accordance with current supplied from a current driver, thereby enabling pixel luminance gray scale display.

FIGS. 25A and 25B are, respectively, a circuit diagram showing the configuration of a conventional voltage driver used for performing voltage driving of a display apparatus for implementing the above-described gray scale display, and a graph showing the relationship between a power-supply potential of a power supply voltage supply line and the distance from a power-supply voltage supply unit.

As shown in FIG. 25A, the conventional voltage driver (output circuit for gray scale control) includes: a power-supply voltage supply unit 1112; gray scale control units 1101a, 1101b, ..., and $1101_N$ (N: a natural number) each of which are connected to the power-supply voltage supply unit 1112 and has an output unit 1116; a current supply unit 1110 connected to the ground; a first MISFET 1111 which is a P-channel MISFET provided between the power-supply voltage supply unit 1112 and the current supply unit 1110 and having a drain and a gate electrode connected to each other; a first node 1118 provided between the first MISFET 1111 and the power-supply voltage supply unit 1112; a gate bias supply line 1115 connected to the gate electrode of the first MISFET 1111; a power-supply voltage supply wire 1121 connected to the first node 1118 and used for supplying the power supply voltage to each of the gray scale control units; a power-supply voltage supply node 1117 provided on the power-supply voltage supply wire 1121 and connected to each of the gray scale control units 1101a, 1101b, ..., and $1101_N$; and resistor 1113 individually provided between the power-supply voltage supply nodes 1117 and between the power-supply voltage supply node 1117 and the first node 1118. Herein, there is shown an example that the N gray scale control units are provided. In many cases, one output circuit for gray scale control includes about 400 to 500 gray scale control units.

In the conventional output circuit for gray scale control, current mirror circuits are utilized for the gray scale control units 1101a, 1101b, ..., and $1101_N$.

In specific, as shown FIG. 25A, the gray scale control unit 1101a has: a P-channel second MISFET 1102a and a P-channel third MISFET 1103a of which the sources are connected to each other and which are connected to the power-supply voltage supply node 1117; a voltage selection switch 1120a; an operational amplifier 1106a in which the voltage selection switch 1120a is connected to a (+) side of an input unit, and the output unit 1116 is connected to a (−) side thereof; an output-side transistor 1105a which is an N-channel MISFET having a source connected to the ground, a drain connected to the third MISFET 1103a, and a gate electrode connected to the output unit of the operational amplifier 1106a; a first node 1114a provided between the output-side transistor 1105a and the third MISFET 1103a and connected to the output unit 1116; and an oscillation-preventing capacitor 1119a provided between wires connecting between the output unit of the operational amplifier 1106a and the gate electrode of the output-side transistor and connecting between the output-side transistor 1105a and a second node. In addition, the second MISFET 1102a and the operational amplifier 1106a together constitute a differential circuit 1107a, and the third MISFET 1103a, the first node 1114a, the oscillation-preventing capacitor 1119a and the output-side transistor 1105a together constitute an output buffer unit 1108a. Herein, in the conventional gray scale control unit 1101a, electrical characteristics of the second MISFET 1102a and the third MISFET 1103a are homogenized mutually, and the gate electrodes thereof are both connected to the gate bias supply line 1115, thereby together constituting the current mirror circuit. In addition, the configuration is designed such that a current $I_2$ flowing through the third MISFET 1103a is higher than a current $I_1$ flowing through the second MISFET 1102a in order to driving a load.

In the conventional output circuit for gray scale control, each of the N gray scale control units 1101a, 1101b, ..., and 1101$_N$ has the same circuit configuration as the above-described gray scale control unit 1101a. Each of the gate electrodes of the second MISFETs 1102a, 1102b, ..., and 1102$_N$ and the third MISFETs 1103a, 1103b, ..., and 1103$_N$ are connected to the gate bias supply line 1115. As shown in FIG. 25B, equal voltages are applied from the gate bias supply line 1115 to the gate electrodes of these MISFETs so that these MISFETs are turned on.

In addition, for the voltage selection switch, the conventional output circuit for gray scale control uses a multiplexer capable of selecting a plurality of reference voltages corresponding to digital data. Voltages selected herein are current-amplified by the operational amplifier and are outputted to the panel using, for example, a liquid crystal or organic EL material.

The conventional output circuit for gray scale control which is used for current-driving and for the current-write-scheme employed organic EL panel has a configuration including current adding-type D/A converters instead of the gray scale control units 1101a, 1101b, ..., and 1101$_N$ of the output circuit for gray scale control shown in FIG. 25A. From the D/A converters, currents having magnitudes corresponding gray scale data are supplied to the TFTs and the pixels, thereby enabling a gray scale display with the organic EL panel.

The above-described output circuit for gray scale control which is used for current-driving can be utilized not only as the driver for the organic EL panel but also as a head of an output apparatus such as a printer. Further, the circuit can also be used as a display-apparatus driver or printer head using an inorganic EL or LED (Light Emitting Diode) in addition to the organic EL.

Hereinafter, description will be given of a method for testing the conventional output circuit for gray scale control which is used for current-driving.

FIGS. 26A and 26B are, respectively, a cross-sectional view showing a conventional probe card for testing the conventional output circuit for gray scale control which is used for current-driving, and a block circuit diagram showing a cross section of the conventional probe card.

As shown in FIG. 26A, a test of the conventional output circuit for gray scale control which is used for current-driving is performed in such a manner that a probe card 1156 which is connected, on the upper surface side, to a head 1153 of a semiconductor tester 1152 and has, on its lower surface, probes 1155 made of a conductor is mounted on a wafer to be tested 1151 in which a large number of current drivers are provided.

In specific, as shown in FIG. 26B, testing currents are supplied to flow from the head 1153 of the semiconductor tester 1152 in a state where a testing pad 1154 (or bump) provided on the wafer is brought into contact with the probe 1156, and currents outputted from the testing bump are then detected.

Many organic EL diodes exhibit a peak luminance at a supplied current of 1 μA or less. As such, in an organic EL panel having 6-bit gray scales (64 gray scales), the current per gray scale is about 10 to 20 nA. Therefore, the semiconductor tester 1152 can detect currents of about 10 to 20 nA. Devices used herein such as the semiconductor tester, the probe card, jigs for connection with the semiconductor tester and the probe card are similar to those used for general wafer testing.

Hereinafter, description will be given of drawbacks occurring with the conventional technique.

As can be seen from FIG. 25B, in the conventional voltage driver, the identical gray scale control units are connected to the single power-supply voltage supply wire 1121. Therefore, the supplied voltage drops due to the presence of the resistors 1113 and the like in the power-supply voltage supply node 1117 placed at a position away from the power-supply voltage supply unit 1112. On the other hand, since the potential of the gate bias supply line 1115 is constant regardless of the position, a voltage $V_{GS}$ applied between the gate and the source of each of the second MISFET 1102 and the third MISFET 1103 is varied depending on the distance from the power-supply voltage supply unit 1112.

On the other hand, the oscillation-preventing capacitor is charged with the output current of the differential circuit (output from the operational amplifier). Generally, since a current flowing on the side of a differential circuit is less than that flowing on the side of an output buffer, the length of charging time for the oscillation-preventing capacitor is determined depending on the current that flows to the differential circuit. In addition, according to variations in the power supply voltage supplied to each of the differential circuit, the magnitude of the current $I_1$ is varied. Thus, in the conventional voltage driving output circuit for gray scale control, according to variations in the power supply voltage that is supplied to each of the differential circuits, the magnitude of the current distributed to the differential circuit is varied, and charging time for the oscillation-preventing capacitor is also cause to vary. Consequently, in the voltage driving output circuit for gray scale control, the slew rate of the operational amplifier is varied depending on the distance from the power-supply voltage supply unit 1112, and in addition, the current output from the output unit is varied.

Because of the above, defects such as screen-display variations occur on the liquid crystal or organic EL panel using the conventional voltage driving output circuit for gray scale control. In addition, print variations can occur when the conventional voltage driving output circuit for gray scale control is used as a printer head.

Defects as those occurring due to the voltage drop occurring across the power-supply voltage supply wire also occur with the conventional current driving output circuit for gray scale control that has the configuration similar to that of the voltage driving output circuit for gray scale control.

In the conventional current driving output circuit for gray scale control, the current mirrors are used to directly distribute currents to 176 output units from the single power supply. While one of the output currents is input to the above-described gray scale control unit, a defect occurs in that also the output current varies in units of the output unit.

In addition, in the method for testing the conventional output circuit for gray scale control, the current value to be detected is as small as 10 to 20. As such, a defect occurs in that the detection signal diminishes between the probe card 1151 and the semiconductor tester 1152. This is because the detection signal is propagated through, for example, the probe card 1151, a connection wire 1158, and jigs. This makes it difficult to test the output circuit for gray scale control with sufficiently high accuracy.

SUMMARY OF THE INVENTION

An object of the present invention is to provide an output circuit for gray scale control which is used with, for example, a display apparatus or an output apparatus and implements an excellent gray scale display, and means for testing a current driving output circuit for gray scale control.

An output circuit for gray scale control according to a first aspect of the present invention includes a power-supply voltage supply unit; a first current supply unit; a first power-supply voltage supply wire connected to the power-supply voltage supply unit; a second power-supply voltage supply wire connected to the power-supply voltage supply unit; a first MISFET which is provided between the first current supply unit and the power-supply voltage supply unit and has a gate electrode connected to the power-supply voltage supply unit; a plurality of gray scale control units each having an output buffer unit including a first transistor connected to the first power-supply voltage supply wire, and a differential circuit including a second transistor which is connected to the second power-supply voltage supply wire and constitutes a current mirror together with the first transistor; and a bias supply line which is connected to the gate electrode of the first MISFET and controls currents flowing to the first transistor and the second transistor.

With this configuration, since the wires are discretely provided for supplying the power-supply voltage to the differential circuit and the output buffer unit, voltage drops occurring in the first power-supply voltage supply wire and the second power-supply voltage supply wire can be reduced to be smaller in comparison to a case where the separated power-supply voltage supply wire are not provided. Therefore, variations in inter-gate-source voltages or inter-gate-drain voltages of the first transistor and the second transistor that can occur depending the difference in the distance from the power-supply voltage supply unit can be reduced. Consequently, since variations in the current flowing through each of the output buffer units can be reduced, and also variations in the current flowing through each of the differential circuits can be reduced, variations in the current to be outputted from each of the output units of the gray scale control units can be reduced. As such, using the output circuit for gray scale control of the present invention for a display apparatus enables display variations across the panel to be reduced. In addition, using the output circuit for gray scale control for a head of a printer enables print variations in the printer to be reduced.

Both of the first transistor and the second transistor may be MISFETs of the same conductive type, having a gate electrode connected to the bias supply line.

Since the current flowing through the first transistor at the time of driving is larger than the current flowing through the second transistor, a high load such as a panel of a display apparatus can be efficiently driven.

Since the gray scale control unit further has a voltage selection switch for supplying a voltage for gray scale control to the output buffer unit, the output circuit for gray scale control of the present invention can be preferably used for a display apparatus or an output apparatus employing the voltage distribution scheme such as a liquid crystal panel.

Since the differential circuit has an operational amplifier of which an input unit is connected to the voltage selection switch and an output unit is connected to the output buffer unit, the current of a voltage signal selected by the voltage selection switch can be amplified.

Since the output circuit for gray scale control further includes: a second current supply unit; and a MISFET for tilted-bias which is connected to the second current supply unit and the first power-supply voltage supply wire, and is of the same conductive type as the first MISFET, and the gate electrode of the MISFET for tilted-bias is connected to the first power-supply voltage supply wire and the bias supply line, the tilt of the potential of the bias supply line can be adjusted to voltage drops occurring in the first power-supply voltage supply wire and the second power-supply voltage supply wire. Accordingly, variations in inter-gate-source voltages or inter-gate-drain voltages of the first transistor and the second transistor that can occur depending the difference in the distance from the power-supply voltage supply unit can be efficiently reduced. Consequently, variations in the currents to be outputted from the gray scale control units can be significantly reduced.

The output circuit for gray scale control further includes a second MISFET which is connected to the power-supply voltage supply unit and constitutes a transmission-side current mirror together with the first MISFET, and the second current supply unit is a reception-side current mirror which is connected to the transmission-side current mirror and is constituted of MISFETs of which conductive types are same as each other. Consequently, even when the reception-side current mirror is located in a position away from the power-supply voltage supply unit, the same current as that flowing through the transmission-side current mirror can be caused to flow to the reception-side current mirror.

An output circuit for gray scale control according to a second aspect of the present invention includes: a power-supply voltage supply unit; a first current supply unit; a power-supply voltage supply wire connected to the power-supply voltage supply unit; a first MISFET which is provided between the first current supply unit and the power-supply voltage supply unit and has a gate electrode connected to the power-supply voltage supply unit; a plurality of gray scale control units each having a transistor connected to the power-supply voltage supply wire; a second current supply unit; a MISFET for tilted-bias which is connected to the second current supply unit and the power-supply voltage supply wire and is of the same conductive type as the first MISFET; and a bias supply line which connects between a gate electrode of the first MISFET and a gate electrode of the MISFET for tilted-bias, is connected to the power-supply voltage supply wire, and controls currents flowing to the transistors.

With this configuration, since the tilt of the potential of the bias supply line can be adjusted to voltage drops occurring in the bias supply line. Accordingly, variations in the currents flowing through the transistors of the gray scale control units can be reduced. In addition, since the concentrated single power-supply voltage supply line is used, the wiring areas can be reduced to be smaller than in the case where the separated power-supply voltage supply line is separated.

Since the plurality of gray scale control units are each a current adding-type D/A converter, variations in the output currents from the gray scale control units can be reduced with higher accuracy.

The output circuit for gray scale control further includes a second MISFET which is connected to the power-supply voltage supply unit and constitutes a transmission-side current mirror together with the first MISFET, and the second current supply unit is a reception-side current mirror which is connected to the transmission-side current mirror and is constituted of MISFETs of which conductive types are same as one another. Consequently, even when the reception-side current mirror is located in a position away from the power-supply voltage supply unit, the same current as that flowing through the transmission-side current mirror can be caused to flow to the reception-side current mirror. As such, constant currents can be supplied to the gray scale control unit located in a position away from the power-supply voltage supply unit without being influenced by a voltage drop. Consequently, variations occurring due to the output units of the gray scale control units can further be reduced.

Since the plurality of gray scale control units are each a current adding-type D/A converter, the output circuit for gray scale control according to the present invention can be used as, for example, a current driver of a display apparatus using light emitting devices or a printer head of an output apparatus such as a printer using light emitting devices, for an organic EL panel or the like.

The plurality of gray scale control units has: a plurality of current mirror units mutually parallel-connected to the power-supply voltage supply node to represent M gray scales when M is a multiple integer of 2; the same number of selecting switches connected to the current mirror units; and a current output unit connected to all the selecting switches, and the current mirror unit is constituted of current mirrors constituted of the transistors. Consequently, the output circuit for gray scale control to be used for a current drive scheme display apparatus or an output apparatus can be manufactured to have a relatively simple configuration.

Since the current mirror unit is constituted of 1, 2, ..., M/2 pieces of current mirrors having mutually same device configurations to control the M gray scales, a current adding-type D/A converter with high precision can be realized. Consequently, an output circuit for gray scale control implementing an excellent gray scale display can be realized.

The transistors may be MISFETs having mutually same device configurations, and an output current from each of the current mirror units may be adjusted according to a ratio of a gate width of the MISFET to a gate length thereof.

The gray scale control unit has a plurality of gray scale generation units having the current mirror units and selecting switches having the same numbers of transfer gates and inverters connected to the current mirror units, and the current mirror units and the selecting switches are collectively disposed for each gray scale generation unit. Consequently, a reduction in the area of the output circuit for gray scale control of the present invention that implements an excellent gray scale display can be implemented.

The transistors may be of the same conductive type and are a first transistor and a second transistor constituting a current mirror, and the gray scale control unit may have an output buffer unit having the first transistor, and a differential circuit having the second transistor. This configuration can be preferably employed, particularly, when it is used as a voltage driver.

A current flowing through the first transistor at the time of driving is larger than a current flowing through the second transistor. This is preferable to drive a load such as a panel.

The gray scale control unit further has a voltage selection switch for supplying a voltage for gray scale control to the output buffer unit. Consequently, the configuration can be preferably used as a voltage driver in which variations in output currents are reduced or as a head for a voltage drive scheme printer.

Since the differential circuit has an operational amplifier of which an input unit is connected to the voltage selection switch and an output unit is connected to the output buffer unit, a voltage driver of a two-stage amplifier type can be realized.

An output circuit for gray scale control according a third aspect of to the present invention includes: a plurality of multistage current mirror units which are constituted of plurality of current mirrors, in which the same current as a current flowing through a first stage of the current mirrors flows to each of three or more stages of the current mirrors; and a plurality of gray scale control units for receiving reference voltages and gray scale signals from each of the plurality of multistage current mirror units, and outputting gray scale controlling currents different from one another.

With this configuration, variations in the values of currents to be inputted to the gray scale control units are reduced by use of the multistage current mirrors. In addition, the characteristics of the output current of the output circuit for gray scale control can be controlled to be close to the γ characteristics of a light emitting device, such as an organic EL device, an inorganic EL devices and a LED, by use of the plurality of gray scale control units for outputting gray scale controlling currents different from one another. Consequently, in a case where the output circuit for gray scale control of the present invention is used for a display apparatus, the display characteristics are improved while in a case where the output circuit is used for an output apparatus, the print characteristics can be improved.

Since the output current of the output circuit for gray scale control further includes an output control unit for receiving the gray scale controlling signals from the plurality of gray scale control units, and varying combinations of the gray scale controlling currents outputted according to the gray scale signals, the characteristics of the output current of the output circuit for gray scale control can be controlled to be close to the γ characteristics of the light emitting device. Consequently, an excellent gray scale display can be implemented with, for example, a display panel or printer that uses the output circuits for gray scale control according to the present invention.

The plurality of gray scale control units are separated into low-side gray scale control units capable of controlling gray scales in the lowest range and high-side gray scale control units capable of controlling gray scales higher than those controlled by the low-side gray scale control units, among the plurality of gray scale control units, and the plurality of multistage current mirror units are separated into low-side multistage current mirror units connected to the low-side gray scale control units and high-side multistage current mirror units connected to the high-side gray scale control units. Consequently, the characteristics of output currents of the output circuits for gray scale control can be controlled to be close in a good condition to the γ characteristics of the light emitting device.

The output control unit controls such that only the gray scale controlling currents from the low-side gray scale control unit are outputted when the number of gray scales is equal to or less than a predetermined value, and the gray scale controlling currents from the high-side gray scale control unit are outputted in addition to the gray scale controlling currents from the low-side gray scale control unit when the number of gray scales exceeds the predetermined value. Consequently, the characteristics of output currents of the output circuit for gray scale control can be controlled to vary corresponding to the tilt of a γ characteristics (current-luminance characteristics) graph of the light emitting device.

The low-side multistage current mirror units, the high-side multistage current mirror units, the low-side gray scale control units and the high-side gray scale control units for at least three colors red, green and blue are integrated into a same chip. Consequently, the output circuit for gray scale control of the present invention can be used as a driver IC of a color display. In addition, the output circuit for gray scale control can be used as a printer head of a color printer.

The low-side multistage current mirror units and the high-side multistage current mirror units are each disposed in a pair to be adjacent to one another and are disposed in a predetermined order of colors in a column direction, the low-side gray scale control units, the high-side gray scale control unit and the output control units are disposed substantially in a matrix, and the low-side gray scale control unit, the high-side gray scale control unit and the output control unit which are connected to the one pair of the low-side multistage current mirror unit and the high-side multistage current mirror unit are collectively disposed. Consequently, the wiring areas can be reduced, thereby resulting in the miniaturization of a display panel.

Each of the plurality of gray scale control units includes a plurality of gray scale generation units having current mirror units and selecting switches having the same numbers of transfer gates and inverters connected to the current mirror units, and the current mirror units and the selecting switches are collectively disposed for each gray scale generation unit. Consequently, redundant wires between the current mirror units and the inverters can be reduced and the wiring area can be effectively reduced, as compared with the layout in which the respective devices are collectively disposed. In addition, the output impedance of the gray scale control circuit can be reduced by enlarging the width of the output wire of the gray scale control circuit.

Since the output circuit for gray scale control further includes a current increment control circuit for outputting to the output control unit currents for incrementing the output current from the low-side gray scale control unit and the output current from the high-side gray scale control unit upon reception of increment control signals and the reference voltage supplied from the multistage current mirrors, the contrast of a display in, for example, a panel using light emitting devices, can be improved.

Since the output circuit for gray scale control further includes a current increment control circuit for outputting a current for incrementing the output current from the low-side gray scale control unit, between the low-side multistage current mirror unit and the low-side gray scale control unit, the output current of the gray scale control unit can be incremented while increase in the area is minimized.

The current increment control circuit can also have a function of increasing or reducing a current outputted in correspondence with a gray scale to be controlled.

The output control circuit further has: a selective precharge circuit for supplying a voltage for charging an external signal line in accordance with switching control; and a selective precharge control circuit for holding the selective precharge circuit in an on-state for a predetermined period of time in accordance with timing control corresponding to display data. Consequently, signal lines of, for example, a display panel, can be precharged using the selective precharge circuit. Accordingly, a black display in a display panel can be quickly executed. This is particularly effective in a case where TFTs formed of low-temperature polysilicon are arranged over a panel of a display apparatus.

An output circuit for gray scale control according to a fourth aspect of the present invention includes: an internal circuit which is integrated into a semiconductor chip and has an output unit for outputting a current signal; an external terminal provided on the semiconductor chip and connected to the output unit; and a resistor which is provided on the semiconductor chip, is connected to the output unit, and converts the current signal into a voltage signal.

With this configuration, since a minute current outputted from an internal circuit can be converted by a resistor on a chip into a voltage signal, the voltage signal can be arranged not to be easily attenuated by, for example, a probe or a jig. Consequently, high-accuracy testing can be implemented.

The output circuit for gray scale control further includes a switching circuit connected to the resistor, and the switching circuit is capable of performing switching operations so that: at normal operation time and power cut time, the resistor and the internal circuit are mutually series connected to the external terminal; and at testing time, the resistor is connected to the ground, and the resistor and the external terminal are mutually parallel connected to the output unit. Since the amount of current to be inputted from the outside can be restricted by the resistor, the internal circuit can be protected when a high voltage current (surge) is inputted from the external terminal. Further, at test time, the resistor can be used to function as a resistance for a current/voltage conversion.

The internal circuit has: a multistage current mirror unit; and a gray scale control unit for outputting gray scale control current upon reception of a reference voltage from the multistage current mirror unit.

An output circuit for gray scale control according to a fifth aspect of the present invention includes: a plurality of gray scale control units having a plurality of bit cells;
a normal operating latch circuit provided for each bit cell; a common latch circuit for supplying signals to all the bit cells; and a selection circuit which is provided between the common latch circuit and the normal operating latch circuit and the bit cell and performs switching operations such that the signal from the normal operating latch circuit is transferred to the bit cell at normal operation time, and the signal outputted from the common latch circuit is transferred to the bit cell at testing time.

With this configuration, since a signal applied in testing time is enabled to flow without passing through a latch circuit, test time can be reduced.

The output circuit for gray scale control may further include a multistage current mirror unit for supplying reference voltages in each of the plurality of gray scale control units.

A testing apparatus for an output circuit for gray scale control according to the present invention includes a substrate having an upper surface settable to a tester for testing wafers; probes which are made of a conductor, are provided on an undersurface of the substrate, and receive current signals from at least from a wafer to be tested; resistors disposed on the substrate in proximity to the probes and connected to the probes to convert the current signals into voltage signals; and wires connected to the resistors and provided to pass through the substrate.

With this configuration, when a minute current signal is outputted from the wafer to be tested, since the current signal can be converted by the resistor to a voltage signal, the current signal can be transferred to reach the tester. As such, the test of a wafer including output circuit for gray scale control which outputs a minute current signal can be executed.

Preferably, the distance between the probe and the resistor is equal to or less than 10 cm.

Since the testing apparatus further includes operational amplifiers connected parallel to the resistors with respect to the probe, in which an output unit is connected to negative-side input units via the resistors, a signal outputted from the wafer to be tested can be easily measured by a tester.

Since a reference voltage outputted from the tester is inputted to a positive-side input unit of the operational amplifier, a signal from the wafer can easily be tested by varying the reference voltage even when the range of values of output currents of the wafer to be tested is wide.

Since the resistors are integrated, the testing apparatus according to the present invention can easily be realized.

Since the operational amplifiers are integrated, the testing apparatus according to the present invention can easily be realized.

A method for testing an output circuit for gray scale control according to the present invention is a method for testing an output circuit for gray scale control including reference current sources connected to first resistors mutually parallel connected, and gray scale control units which are connected to the reference current sources and output currents for gray scale control, the method including: connecting, at testing time, second resisters which are provided parallel to the first resisters and have a resistance value lower than that of the first resisters, to the reference current sources; and turning off, at normal operation time, the connection between the second resisters and the reference current sources.

With this method, since a current inputted to the reference current source at testing time can be increased larger than the test current, testing can easily implemented.

BRIEF DESCRIPTION OF THE DRAWINGS

FIG. 15A is a circuit diagram showing a configuration of a gray scale control circuit, FIG. 15B is a view schematically showing a reference example of a layout of the gray scale control circuit, and FIG. 15C is a view schematically showing a gray scale control circuit according to an eighth embodiment of the present invention.

FIGS. 16A and 16B are, respectively, a view showing current value-gray scale level characteristics of an output circuit for gray scale control shown in FIG. 16B and a block circuit diagram showing an example of an output circuit for gray scale control in which a current mirror for an incrementing circuit unit is provided.

FIG. 17 is a view showing a current increment control circuit in an output circuit for gray scale control according to a ninth embodiment of the present invention.

FIG. 23 is a circuit diagram of a selection circuit in a semiconductor chip according to a fourteenth embodiment of the present invention.

FIG. 24 is a view used to explain a driving scheme for an organic EL panel.

DETAILED DESCRIPTION OF THE INVENTION

Embodiment 1

As a first embodiment of the present invention, an output circuit (voltage driver) for gray scale control in which a wire is separated into a wire for supplying a power-supply voltage to differential circuits and a wire for supplying the power-supply voltage to output buffer units will be described hereinafter with reference to drawings.

Basic Configuration of Voltage Driving Output Circuit for Gray Scale Control

Figure 1:
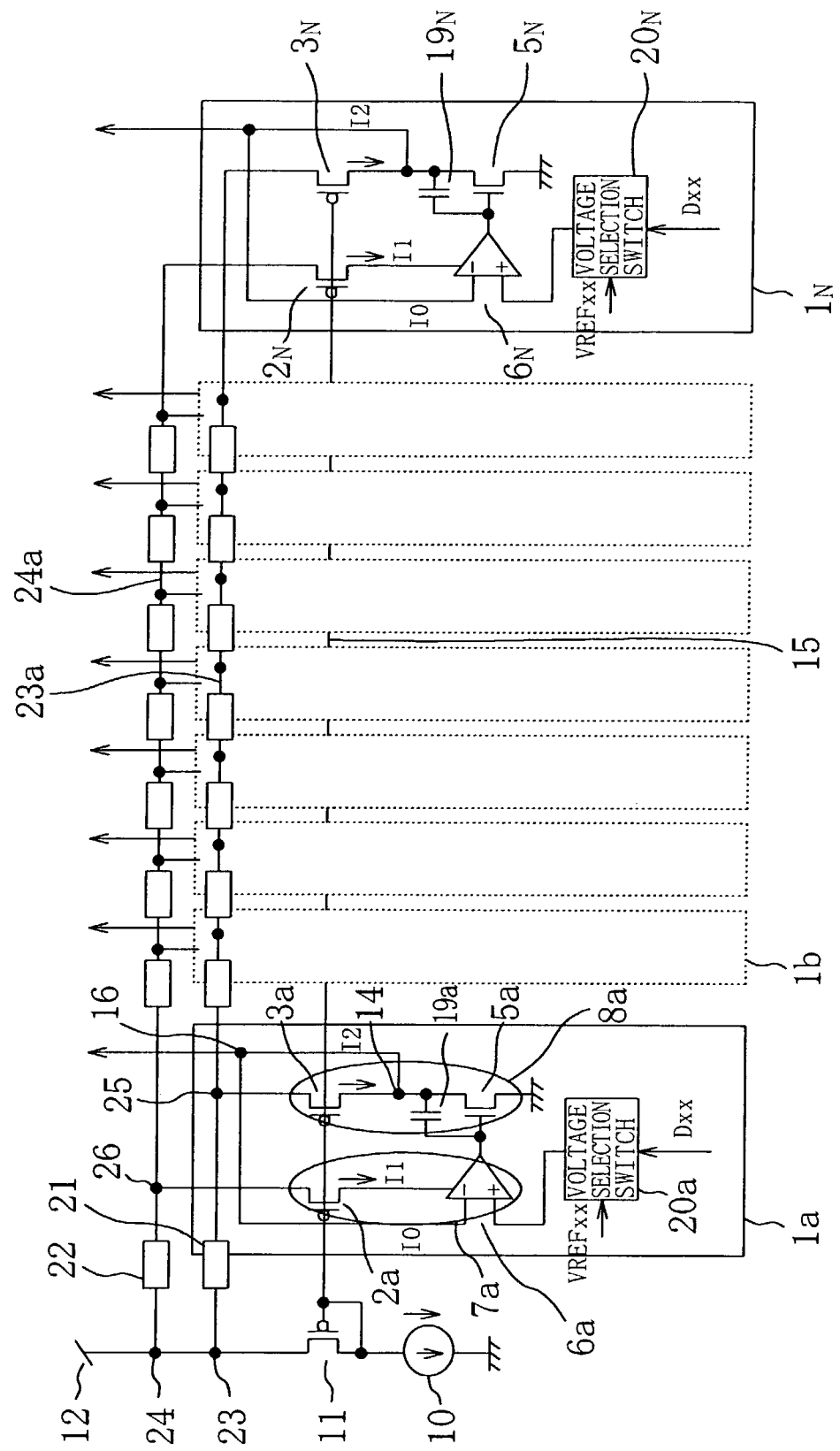
FIG. 1 is a circuit diagram showing a configuration of an output circuit for gray scale control according to a first embodiment of the present invention.

FIG. 1 is a circuit diagram showing the configuration of the output circuit for gray scale control according to the first embodiment of the present invention.

As shown in the drawing, the output circuit for gray scale control of the present embodiment includes a power-supply voltage supply unit 12; a current supply unit 10 that is connected to the power-supply voltage supply unit 12 and that supplies a predetermined current; a P-channel MISFET, namely, a first MISFET 11, that is provided between the power-supply voltage supply unit 12 and the current supply unit 10 and that has drain and gate electrodes mutually coupled; a first node 23 and a second node 24 that are provided between the first MISFET 11 and the power-supply voltage supply unit 12; gray scale control units 1a, 1b, . . . , and $1_N$ (N represents an integer) that each include a differential circuit 7a, a voltage selection switch 20a, an output buffer unit 8a, and an output unit 16; a gate bias supply line 15 coupled to the gate electrode of the first MISFET; a voltage supply line 23a for an output unit that connects between the first node 23 and the output buffer units 8a of the gray scale control unit $1_N$ and that supplies the voltage to the output buffer unit of each of the gray scale control units; a first power-supply voltage supply node 25 that is provided to the voltage supply line 23a for an output unit and that is connected to the output buffer unit of each of the gray scale control units 1a, 1b, . . . , and $1_{N-1}$; first resisters 21 individually provided between the first power-supply voltage supply node 25 and the first node 23 and between the individual first power-supply voltage supply nodes 25 on the voltage supply line 23a for an output unit; a voltage supply line 24a for a differential circuit that connects between the second node 24 and the differential circuit $7_N$ of the gray scale control unit $1_N$ and that supplies the voltage to the differential circuit of each of the gray scale control units; a second power-supply voltage supply node 26 that is provided to the voltage supply line 24a for a differential-circuit and that is connected to the differential circuit of each of the gray scale control units 1a, 1b, . . . , and $1_{N-1}$; and second resisters 22 individually provided between the second power-supply voltage supply node 26 and the first node 23 and between the second power-supply voltage supply nodes 26 on the voltage supply line 24a for a differential circuit. In many cases, one output circuit for gray scale control includes about 400 to 500 gray scale control units. Ordinarily, the output circuits for gray scale control according to the present embodiment are integrated into a same chip.

The first resister 21 and the second resister 22 are generated by factors attributed to, for example, the layout; however, it is ideal that they do not exist.

Configuration of Gray Scale Control Unit

Similar to the conventional output circuit for gray scale control, the gray scale control unit of the present embodiment includes a current mirror circuit constituted using MISFETs.

As shown FIG. 1, the gray scale control unit 1a includes a P-channel third MISFET 3a of which the source is connected to the first power-supply voltage supply node 25; a P-channel second MISFET 2a of which the source is connected to the second power-supply voltage supply node 26; a voltage selection switch 20a; an operational amplifier 6a in which the voltage selector switch 20a is coupled to a (+) side of an input unit, and an output unit 16 is coupled to a (−) side thereof; an N-channel MISFET, namely, an output-side transistor 5a in which the source is connected to the ground, the drain is connected to the third MISFET 3a, and the gate electrode is connected to the output unit of the operational amplifier 6a; a third node 14 that is provided between the output-side transistor 5a and the third MISFET 3a and is connected to an output unit 16; and an oscillation-preventing capacitor 19a provided between wires that connects between output unit of the operational amplifier 6a and the gate electrode of the output-side transistor Sa and between the output-side transistor 5a and the third node 14.

In addition, the second MISFET 2a and the operational amplifier 6a together constitute a differential circuit 7a; and the third MISFET 3a, the third node 14, the oscillation-preventing capacitor 19a, and the output-side transistor Sa together constitute an output buffer unit 8a. In this case, in the gray scale control unit 1a of the present embodiment, electrical characteristics of the second MISFET 2a and the third MISFET 3a are homogenized, and the gate electrodes thereof are both connected to the gate bias supply line 15, whereby the current mirror circuit is constructed. In the output circuit for gray scale control according to the present embodiment, each of the N gray scale control units 1a, 1b, . . . , and $1_N$ has the same circuit configuration as the gray scale control unit 1a. The individual gate electrodes of second MISFETs 2a, 2b, . . . , and $2_N$ and third MISFETs 3a, 3b, . . . , and $3_N$ are connected to the gate bias supply line 15. Approximately same voltages are supplied from the gate bias supply line 15 to gate electrodes of the second MISFETs 2a, 2b, . . . , and $2_N$ and the third MISFETs 3a, 3b, . . . , and $3_N$, and these MISFETs are each kept in an on-state at all times.

Hereinafter, in this Description, when referring the gray scale control units 1a, 1b, . . . , and $1_N$ without distinguishing them from one another, they will each be referred to as a "gray scale control unit 1". Also, when referring to the components of the gray scale control units 1, such as the N pieces of second MISFETs, third MISFETs, output-side transistors, operational amplifiers, and voltage selection switches, without distinguishing them from one another, they will individually be referred to as a "second MISFET 2", "third MISFETs 3", "output-side transistor 5", "operational amplifier 6", and "voltage selection switch 20".

Functions of Gray Scale Control Unit

The gray scale control unit 1 is formed to be a two-stage amplifier with the output buffer unit 8, which is provided to supply the driving voltage to a TFT and a pixel (not shown) of a display panel, and the differential circuit 7 provided to control output of the driving voltage.

First, when the output circuit for gray scale control is driven, power-supply voltages having approximately mutually same values are individually supplied from the first power-supply voltage supply node 25 and the second power-supply voltage supply node 26 to the second MISFET 2 and the third MISFET 3. In response, the current mirror circuit functions to cause currents $I_1$ and $I_2$ to flow to the second MISFET 2 and the third MISFET 3, respectively. The present embodiment is set so that the current $I_2$ is larger than the current $I_1$; specifically, the present invention is set so that a ratio of current $I_1$:current $I_2$ in value is 1:5.

In addition, the voltage selection switch 20 is, for example, a multiplexer which has a function of selecting a plurality of reference voltages corresponding to digital data.

According to negative feedback, the operational amplifier 6 of the differential circuit 7 performs current amplification of a selected voltage negatively fed back and selected by the voltage selection switch 20. Subsequently, the current-amplified voltage is output to a liquid-crystal or organic EL panel from the output unit 16 via the oscillation-preventing capacitor 19. At this time, the oscillation-preventing capacitor 19 modulates the phase the output signal of the operational amplifier 6, and thereby stabilizes the negatively fed back output of the operational amplifier 6.

In the gray scale control unit 1, the oscillation-preventing capacitor 19 is charged with the output current (=current $I_1$) of the operational amplifier) and a current flowing through the output buffer unit 8. However, since a current flowing on the side of the differential circuit 7 is less than that flowing on the side of output buffer unit 8, the length of charging time for the oscillation-preventing capacitor 19 varies depending on the magnitude of the output current of the operational amplifier 6. According to variations in the charging time for the oscillation-preventing capacitor 19, the slew rate of the operational amplifier 6 varies, and charging time for the loads coupled to the output unit 16 is also caused vary. The current flowing on the side of differential circuit 7 varies depending on an inter-gate-source voltage $V_{GS1}$ of the second MISFET 2. As such, when the potential of the gate bias supply line 15 is constant regardless of the position thereof, the output current can be caused to be constant by causing the power-supply voltage supplied from the second power-supply voltage supply node 26 to be constant.

Differences from Conventional Voltage Driver

The output circuit for gray scale control according to the present embodiment is different from the conventional voltage driver in that the separated wires are provided for individually supplying the power-supply voltage to the differential circuits and to the output buffer units.

According to the above, the output circuit for gray scale control according to the present embodiment is capable of reducing a resistor-causing voltage drop to be smaller in comparison to that occurring with the conventional voltage driver. Accordingly, voltage drops in the first power-supply voltage supply node 25 and the second power-supply voltage supply node 26 that are located in remote positions from power-supply voltage supply unit 12. Consequently, the voltage difference due to the positions of the first power-supply voltage supply node 25 and the second power-supply voltage supply node 26 can be reduced to be small.

In addition, in the output circuit for gray scale control according to the present embodiment, since the potential of the gate bias supply line 15 is constant regardless of the position thereof, variations in the inter-gate-source voltage $V_{GS1}$ of the second MISFET 2 can be reduced. Accordingly, the current flowing through the differential circuit 7 becomes approximately constant regardless of the distance from the power-supply voltage supply unit 12, thereby enabling the slew rate of the operational amplifier 6 to be approximately constant.

Accordingly, since the charging time for the loads can be caused to be constant by using the output circuit for gray scale control according to the present embodiment, consequently enabling implementation of, for example, a liquid-crystal panel or a voltage-write-scheme employed organic EL panel that does not cause display variations.

In the output circuit for gray scale control according to the present embodiment, the voltage to be supplied to, for example, a display apparatus can be switched using the voltage selection switch 20, and the gray scale control is thereby performed.

The output circuit for gray scale control according to the present embodiment is used not only as a liquid crystal driver but also as, for example, a printer head.

In the present embodiment, while the ratio of current $I_1$:current $I_2$ in value is set to 1:5, the ratio of the current values is not specifically limited thereto as long as $I_1<I_2$.

In the output circuit for gray scale control according to the present embodiment, although the P-channel MISFETs are used to constitute each of the current mirror circuits, N-channel MISFETs may instead be used.

In the output circuit for gray scale control according to the present embodiment, the current driver may be formed using npn bipolar transistors instead of the MISFETs included in the gray scale control unit 1.

Embodiment 2

FIGS. 2A and 2B are, respectively, a circuit diagram showing the construction of an output circuit for gray scale control (voltage driver) according to a second embodiment of the present invention and a view showing the relationship between the power-supply potential and the distance from the power-supply voltage supply unit.

The voltage driving output circuit for gray scale control of the present embodiment is configured such that a tilt is imparted to the potential of a gate bias supply line 15, and respective inter-gate-source voltages $V_{GS1}$ and $V_{GS2}$ of the second MISFET 2 and the third MISFET 3 are thereby caused to be constant.

As shown in FIG. 2A, the output circuit for gray scale control of the second embodiment includes a power-supply voltage supply unit 12; gray scale control units 1a, 1b, . . . , and $1_N$ (N represents a natural number) that are each connected to the power-supply voltage supply unit 12 and that each include an output unit 16; a first current supply unit 10a that is connected to the ground and that supplies a predetermined current; a P-channel MISFET, namely, a first MISFET 11, that is provided between the first current supply unit 10a and the power-supply voltage supply unit 12 and that has drain and gate electrodes mutually coupled; a first node 18 provided between the first MISFET 11 and the power-supply voltage supply unit 12; a second current supply unit 31 for supplying a predetermined current; a P-channel MIS transistor, namely, a MISFET for tilted-bias 30 that is connected to the second current supply unit 31 and that has drain and gate electrodes mutually coupled; a gate bias supply line 15 that mutually connects the gate electrode of the first MISFET 11 and the gate electrode of the MISFET for tilted-bias 30; a power-supply voltage supply wire 4 that mutually connects the first node 18 and the source of the MISFET for tilted-bias 30 and that supplies the power-supply voltage to the individual gray scale control units 1; a power-supply voltage supply node 17 that is provided to the power-supply voltage supply wire 4 and that is connected to the individual gray scale control units 1a, 1b, . . . , and $1_N$; and resistors 13 individually provided between the power-supply voltage supply nodes 17 and between the power-supply voltage supply node 17 and the first node 18. Similarly to the first embodiment, the output circuit for gray scale control according to the present embodiment is integrated into a same chip. Also, output circuits for gray scale control according to other embodiments described below are each similarly integrated.

The MISFET for tilted-bias 30 may be of either the P-channel type or N-channel type as long as it is of the same conductive type as the first MISFET 11.

In the present embodiment, the gray scale control unit 1 has a configuration similar to that of the first embodiment.

Specifically, as shown in FIG. 2A, the gray scale control unit 1 includes a P-channel second MISFET 2a and a P-channel third MISFET 3a of which the sources are mutually coupled and are connected to the power-supply voltage supply node 17; a voltage selection switch 20a; an operational amplifier 6a in which the voltage selector switch is coupled to a (+) side of an input unit, and an output unit 16 is coupled to a (−) side thereof; an N-channel MISFET, namely, an output-side transistor 5a in which the source is connected to the ground, the drain is connected to the third MISFET 3a, and the gate electrode is connected to the output unit of the operational amplifier 6a; a third node 14 that is provided between the output-side transistor 5a and the third MISFET 3a and is connected to an output unit 16; and an oscillation-preventing capacitor 19a provided between wires that connects between the output unit of the operational amplifier 6a and the gate electrode of the output-side transistor 5a and between the output-side transistor 5a and the third node 14. In addition, the second MISFET 2a and the operational amplifier 6a together constitute a differential circuit 7a; and the third MISFET 3a, the third node 14, the oscillation-preventing capacitor 19a, and the output-side transistor 5a together constitute an output buffer unit 8a.

A feature of the output circuit for gray scale control according to the present embodiment is that the second current supply unit 31 and the MISFET for tilted-bias 30 are provided. Thereby, as described below, the inter-gate-source voltages ($V_{GS1}$ and $V_{GS2}$) of the second MISFET 2 and the third MISFET 3 can be prevented from being reduced following a voltage drop of the power-supply voltage supply node 17.

The MISFET for tilted-bias 30 is kept in an on-state at all times during operation of the present apparatus. Accordingly, the drain of the MISFET for tilted-bias 30 is at a potential in the state where the potential of the power-supply voltage supply unit 12 is reduced following the voltage drop because of at least the resistor 13. Since the drain and gate electrodes of the MISFET for tilted-bias 30 are coupled to one another, the potential of the MISFET for tilted-bias 30 is lower than the potential of the gate electrode of the first MISFET 11. Because of the above, as shown in FIG. 2B, a potential gradient such as indicating that the potential decreases lower as being away from the power-supply voltage supply unit 12 is formed with the gate bias supply line 15. As such, in the output circuit for gray scale control according to the present embodiment, the potential gradient formed with the gate bias supply line 15 is set to be approximately proportional to a voltage-drop ratio of the power-supply voltage supply wire 4, thereby enabling the respective inter-gate-source voltages $V_{GS1}$ and $V_{GS}$ of the second MISFET 2 and the third MISFET 3 to be constant.

Accordingly, the value of the current $I_1$ flowing through the second MISFET 2 can be caused to be constant regardless of the distance from the power-supply voltage supply unit 12, thereby enabling the slew rate of the operational amplifier 6 to be approximately constant. Consequently, with the output circuit for gray scale control according to the present embodiment, voltage signals having uniform current values can be supplied to TFTs and pixels from all the output units 16 of all the gray scale control units 1.

In the output circuit for gray scale control according to the present embodiment, the wire is not separated to a wire for supplying the power-supply voltage to the differential circuits 7 and a wire for supplying the power-supply voltage to the output buffer units 8. Since the area of the MISFET for tilted-bias 30 is very smaller than the area of the voltage supply line, the area of the output circuit for gray scale control according to the present invention is smaller than the output circuit for gray scale control according to the first embodiment. In a configuration where the driver is used for a liquid-crystal panel, it includes multiple outputs (400 to 500 outputs) and is disposed on a peripheral side section of the panel. As such, the small area of the driver is essential to miniaturize the panel.

In addition, in the output circuit for gray scale control according to the present embodiment, since the power-supply voltages for the differential circuit 7 and the output buffer unit 8 are supplied from the power-supply voltage supply wire 4, power-supply voltage of approximately the same value is supplied to each of the differential circuit 7 and the output buffer unit 8 in the single gray scale control unit 1, regardless of, for example, variations in the resistance value of the resistor 13. This is also advantageous to cause the slew rate of the operational amplifier to be constant.

As described above, the slew rate of the operational amplifier 6 can be caused to be constant by using the output circuit for gray scale control, and the charging time for the loads can thereby be caused to be constant. Consequently, display variations occurring on a liquid-crystal panel or an organic EL panel that use the voltage-write scheme can be reduced.

In addition, the output circuit for gray scale control according to the present embodiment can be formed smaller in area than the output circuit for gray scale control according to the first embodiment, it is advantageous for integration, and hence it can be preferably used also for a liquid-crystal panel of a small size.

In the output circuit for gray scale control according to the present embodiment, while the current mirror circuit in the gray scale control unit 1 is formed using the P-channel MISFETs, N-channel MISFETs may instead be used. This can be achieved by using N-channel MISFETs for both the first MISFET 11 and MISFET for tilted-bias 30. This is true also of embodiments according to each of other embodiments describe below.

In addition, also in the output circuit for gray scale control according to the present embodiment, while the ratio of current $I_1$:current $I_2$ in value is set to approximately 1:5, the ratio of the current values is not specifically limited thereto as long as $I_1 < I_2$.

In the output circuit for gray scale control according to the present embodiment, the second current supply unit 31 and the MISFET for tilted-bias 30 are provided to form the potential gradient with the gate bias supply line 15. However, these members may be replaced with a current supply unit independent of the power-supply voltage supply unit 12 and a low-voltage supply unit having a potential lower than the potential of the gate electrode of the first MISFET 11.

Further, in above-described output circuit for gray scale control, a D/A converter including a plurality of current mirrors may be used to replace each of the gray scale control units 1. This enables the implementation of an output circuit for gray scale control that performs current-dependent gray scale control. Even in this case, since inter-gate-source voltages of the MISFETs constituting the individual D/A converters are maintained identical to one another, output currents thereof can be caused to be constant. This output circuit for gray scale control can be used as, for example, a driver of an organic EL panel, a driver of an inorganic EL panel, or a head of a LED printer. Regarding the current current driving output circuit for gray scale control, a description will be provided later in detail.

Embodiment 3

An output circuit for gray scale control according to a third embodiment of the present invention is configured by combining the output circuit for gray scale controls according to the first embodiment and the second embodiment.

Figure 2:
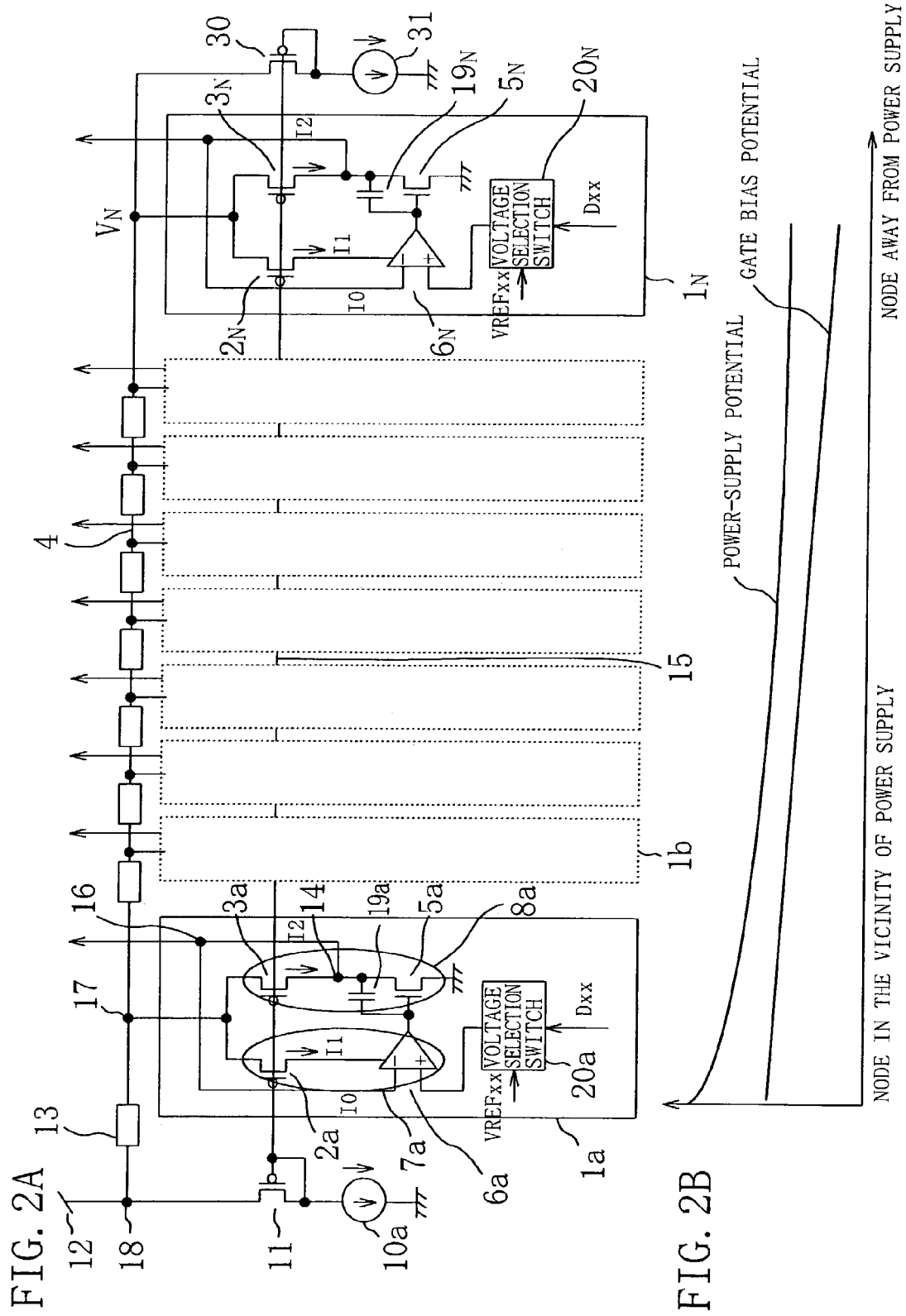
FIGS. 2A and 2B are, respectively, a circuit diagram showing the construction of an output circuit for gray scale control according to a second embodiment of the present invention and a view showing the relationship between the power-supply potential of a power-supply voltage supply line and the distance from the power-supply voltage supply unit.
Figure 3:
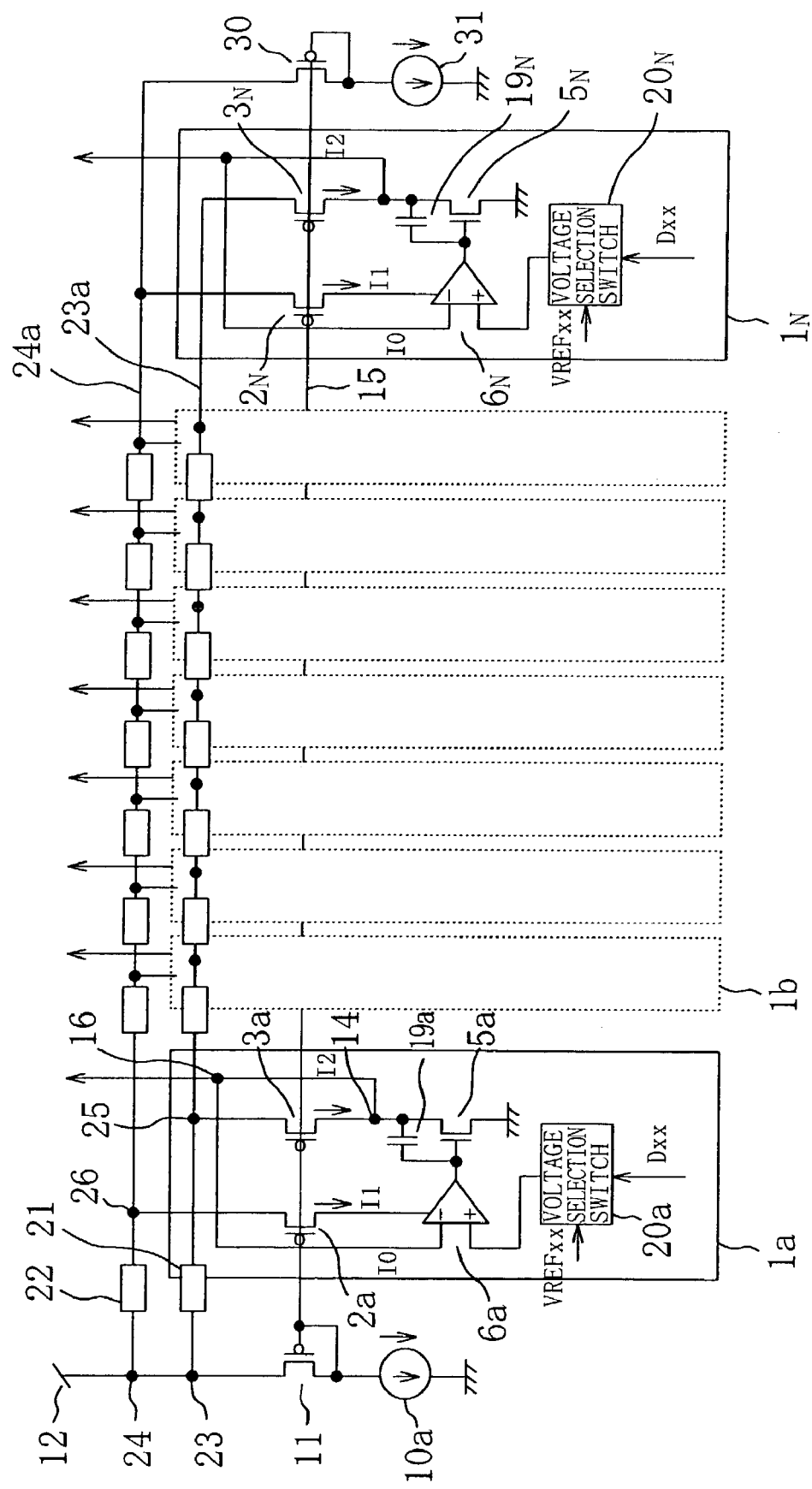
FIG. 3 is a circuit diagram showing a configuration of an output circuit for gray scale control according to a third embodiment of the present invention.

FIG. 3 is a circuit diagram showing the configuration of the voltage driving output circuit for gray scale control according to the third embodiment of the present invention. The same symbols as those shown in FIG. 1 and FIGS. 2A and 2B are used for the same devices and circuits as those in the first and second embodiments.

As shown in FIG. 3, the output circuit for gray scale control according to the present embodiment includes a power-supply voltage supply unit 12; N gray scale control units 1 that are each connected to the power-supply voltage supply unit 12 and that each include a differential circuit 7, a voltage selection switch 20, an output buffer unit 8, and an output unit 16; a first current supply unit 10a that is connected to the ground and that supplies a predetermined current; a P-channel MISFET, namely, a first MISFET 11, that is provided between the first current supply unit 10a and the power-supply voltage supply unit 12 and that has drain and gate electrodes mutually coupled; a first node 23 and a second node 24 that are provided between the first MISFET 11 and the power-supply voltage supply unit 12; a second current supply unit 31 for supplying a predetermined current; a P-channel MIS transistor, namely, a MISFET for tilted-bias 30 that has a source connected to the second current supply unit 31 and that has drain and gate electrodes mutually coupled; a gate bias supply line 15 that mutually connects the gate electrode of the first MISFET 11 and the gate electrode of the MISFET for tilted-bias 30; a voltage supply line 24a for a differential circuit that mutually connects the second node 24 and the source of the MISFET for tilted-bias 30; a second power-supply voltage supply node 26 that is provided to the voltage supply line 24a for a differential circuit and that is connected to each of the differential circuits 7; a second resister 22 provided between the second node 24 and the second power-supply voltage supply node 26 and between the second power-supply voltage supply nodes; a voltage supply line 23a for an output unit that connects between the first node 23 and an N-th third MISFET $3_N$; a first power-supply voltage supply node 25 that is provided to the voltage supply line 23a for an output unit and that is connected to each of the output buffer units 8; and resisters 21 individually provided between the first node 23 and the first power-supply voltage supply node 25 and between the first power-supply voltage supply nodes 25. The configuration of the gray scale control unit 1 is the same as that in the first embodiment.

In the output circuit for gray scale control according to the present embodiment, the wire is separated into the wire for supplying the power-supply voltage to the differential circuits 7 and the wire for supplying the power-supply voltage to the output buffer units 8. This enables reductions in voltage drops occurring in the first power-supply voltage supply node 25 and the second power-supply voltage supply node 26 of each gray scale control unit 1 provided in a position away from the power-supply voltage supply unit 12.

In addition, in the output circuit for gray scale control according to the present embodiment, the potential gradient is formed with the gate bias supply line 15. This enables reductions in variations occurring depending on the positions of the inter-gate-source voltages $V_{GS1}$ and $V_{GS2}$ of each of the second MISFETs 2 and the third MISFETs 3.

As such, in the output circuit for gray scale control according to the present embodiment, regardless of the position of the gray scale control unit 1, the slew rate of the operational amplifier 6 can be caused to be constant with even higher accuracy according to synergetic effects of the two configurations described above, and the charging time for the loads can be caused to be constant. Consequently, display variations occurring on a liquid-crystal panel or an organic EL panel that use the voltage-write scheme can be reduced by using the output circuit for gray scale control according to the present embodiment.

Embodiment 4

The output circuits for gray scale control according to the first to third embodiments are individually set so that the power-supply voltage is distributed to the second MISFETs 2 from the power-supply voltage supply unit 12 via the common voltage supply line (which hereinafter will be referred to as a "voltage distribution scheme"), and the individual inter-gate-source voltages $V_{GS1}$ are approximately constant.

In comparison, an output circuit for gray scale control is such that a reception-side current mirror circuit 43 is provided on the side a MISFET for tilted-bias 30 provided in a position away from a power-supply voltage supply unit 12, whereby a current having the same magnitude as a current supplied from a first current supply unit 10a is distributed to the side of the MISFET for tilted-bias 30 according to inter-current-mirror current distribution. Hereinafter, this scheme will be referred to as a "current delivery scheme".

Figure 4:
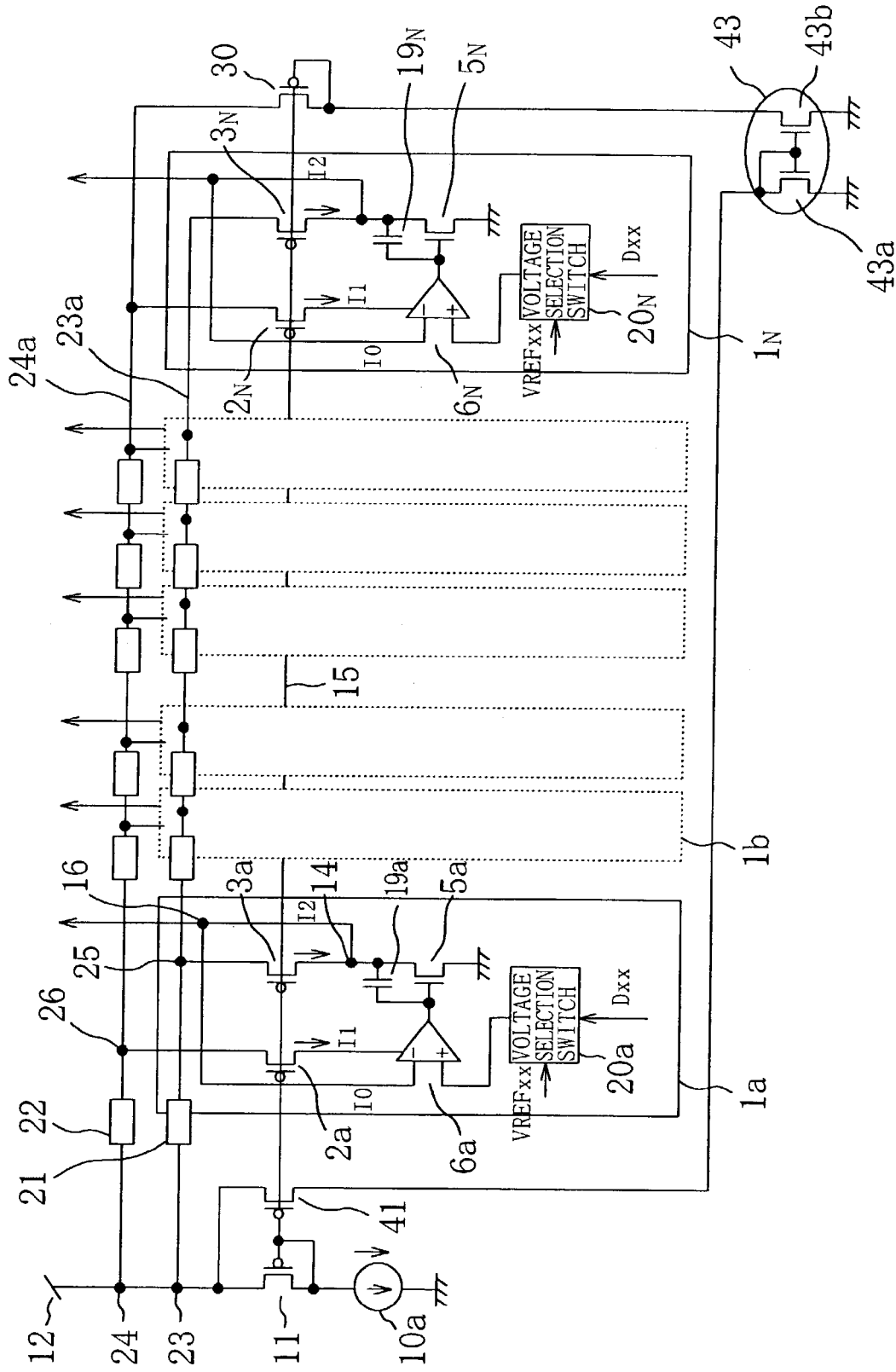
FIG. 4 is a circuit diagram showing a configuration of an output circuit for gray scale control according to a fourth embodiment of the present invention.

FIG. 4 is a circuit diagram showing the configuration of the output circuit for gray scale control according to the present embodiment. The same symbols as those shown in FIG. 1 and FIGS. 2A and 2B are used for the same devices and circuits as those in the third embodiment.

As shown in the figure, the output circuit for gray scale control according to the present embodiment includes a power-supply voltage supply unit 12; N gray scale control units 1 that are each connected to the power-supply voltage supply unit 12 and that each include a differential circuit 7, a voltage selection switch 20, an output buffer unit 8, and an output unit 16; a first current supply unit 10a connected to the ground; a P-channel MISFET, namely, a first MISFET 11, that is forwardly provided between the first current supply unit 10a and the power-supply voltage supply unit 12 and that has drain and gate electrodes mutually coupled; a first node 23 and a second node 24 that are provided between the first MISFET 11 and the power-supply voltage supply unit; the reception-side current mirror circuit 43 constituted of a first mirror MISFET 43a and a second mirror MISFET 43b that are both N-channel MISFETs and that individually have gate electrodes mutually coupled; a fourth P-channel MISFET 41 that has a drain connected to the first mirror MISFET 43a, a gate electrode connected to the gate electrode of the first MISFET 11, and a source connected to the power-supply voltage supply unit 12 and that constitutes a transmission-side current mirror together with the first MISFET 11; a P-channel MIS transistor, namely, a MISFET for tilted-bias 30 that has a source connected to the second mirror MISFET 43b and that has drain and gate electrodes mutually coupled; a gate bias supply line 15 that mutually connects the gate electrode of the first MISFET 11 and the gate electrode of the MISFET for tilted-bias 30; a voltage supply line 24a for a differential circuit that mutually connects the second node 24 and the source of the MISFET for tilted-bias 30; a second power-supply voltage supply node 26 that is provided to the voltage supply line 24a for a differential circuit and that is connected to each of the differential circuits 7; a second resister 22 provided between the second node 24 and the second power-supply voltage supply node 26 and between the second power-supply voltage supply nodes; a voltage supply line 23a for an output unit that connects between the first node 23 and an N-th third MISFET $3_N$; a first power-supply voltage supply node 25 that is provided to the voltage supply line 23a for an output unit and that is connected to each of the output buffer units 8; and resisters 21 individually provided between the first node 23 and the first power-supply voltage supply node 25 and between the first power-supply voltage supply nodes 25. The configuration of the gray scale control unit 1 is the same as that in the third embodiment.

The output circuit for gray scale control according to the present embodiment is such that the reception-side current mirror circuit 43 and the fourth MISFET 41 that distributes the current supplied from the first current supply unit 10a are provided as the second current supply unit 31 of the output circuit for gray scale control according to the third embodiment.

In this case, the first MISFET 11 and the fourth MISFET 41 that constitute the current mirror mutually have same device configurations and electric characteristics; and similarly, the first mirror MISFET 43a and the second mirror MISFET 43b mutually have same device configurations and electric characteristics. In addition, in the output circuit for gray scale control according to the present embodiment, the first MISFET 11, the fourth MISFET 41, the first mirror MISFET 43a, and the second mirror MISFET 43b each operates in a saturated region. As such, the current supplied from the first current supply unit 10a is equalized with the current flowing through the second mirror MISFET 43b with high accuracy.

Further, since constant currents can be supplied from the single bias circuit to remote circuits, an increase in the circuit area can be prevented.

Furthermore, according to the current delivery scheme, the current can be distributed without being influenced by resistor-causing voltage drops. Accordingly, high-accuracy homogenization can be implemented for power-supply voltages supplied to second MISFETs 2 (or differential circuits 7) provided in a position away from the power-supply voltage supply unit 12 (position remote at approximately several millimeters) and the power-supply voltage supplied to a second MISFET (or a differential circuit 7) provided in a position close to the power-supply voltage supply unit 12.

In consequence, in the output circuit for gray scale control according to the present embodiment, regardless of the distance from the power-supply voltage supply unit the inter-gate-source voltage $V_{GS1}$ of each of the second MISFETs 2 is approximately constant, and also the slew rate of each of the operational amplifiers 6 can be caused be caused to be approximately constant. Consequently, display variations occurring on a liquid-crystal panel or an organic EL panel that use the voltage-write scheme can be reduced by using the output circuit for gray scale control according to the present embodiment.

In the present embodiment, while the example of combining the voltage distribution scheme and the current delivery scheme has been described, the current mirror circuits may be provided in individual portions between the second MISFETs 2 to enable the current to be distributed to all the second MISFETs 2 according to the current delivery scheme. In this case, however, since the area is increased, it is preferable in practice that the power-supply voltage be distributed to second MISFETs 2 positioned relatively closer to the power-supply voltage supply unit 12 according to the voltage distribution scheme, and that the current be distributed to second MISFETs 2 positioned relatively farther from the power-supply voltage supply unit 12 according to the current delivery scheme.

Embodiment 5

As a fifth embodiment of the present invention, an example of a current driving output circuit for gray scale control to which the configurations of the voltage driving output circuit for gray scale control described in the first to fourth embodiments are applied will be described hereinafter.

Figure 5:
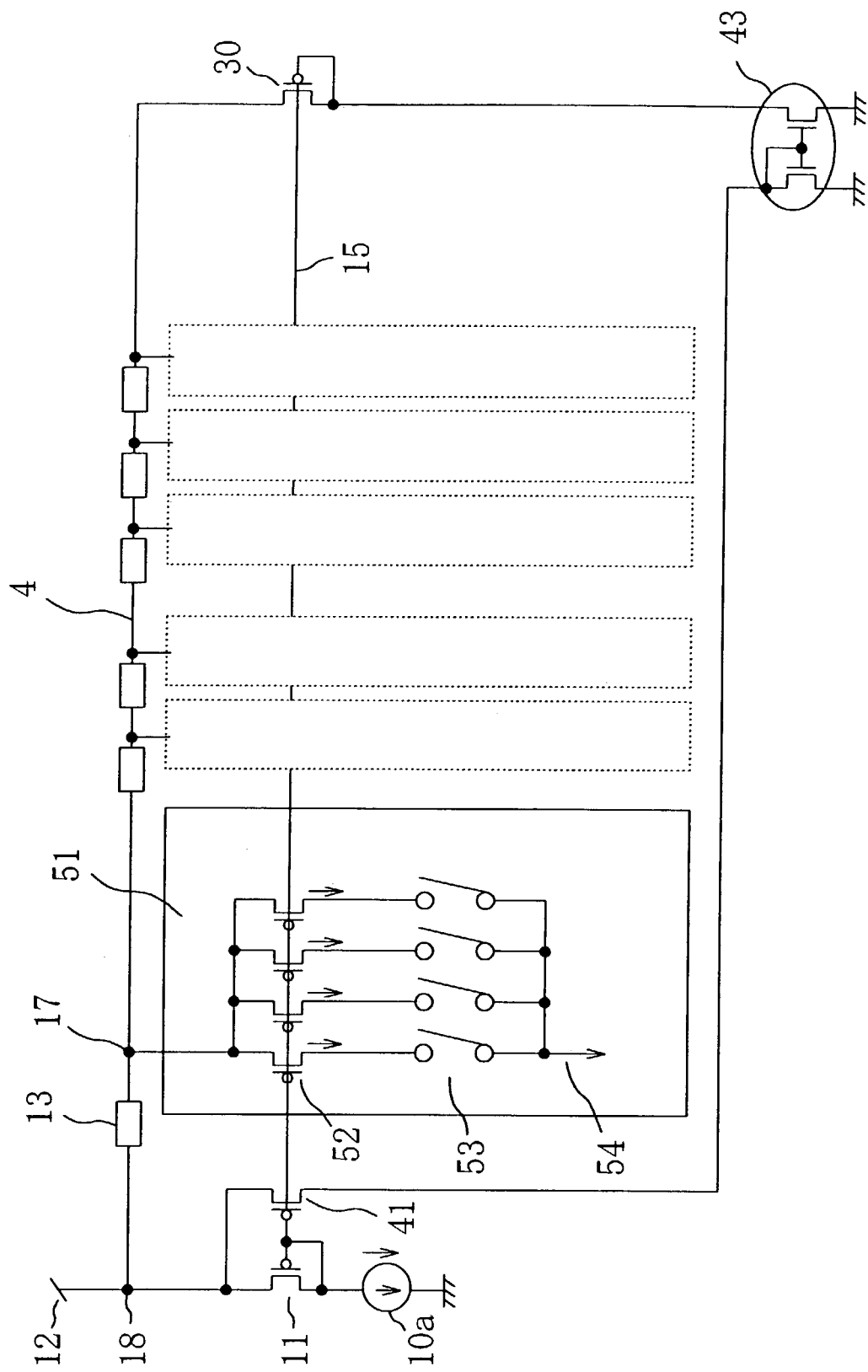
FIG. 5 is a circuit diagram showing a configuration of an output circuit for gray scale control according to a fifth embodiment of the present invention.
Figure 6:
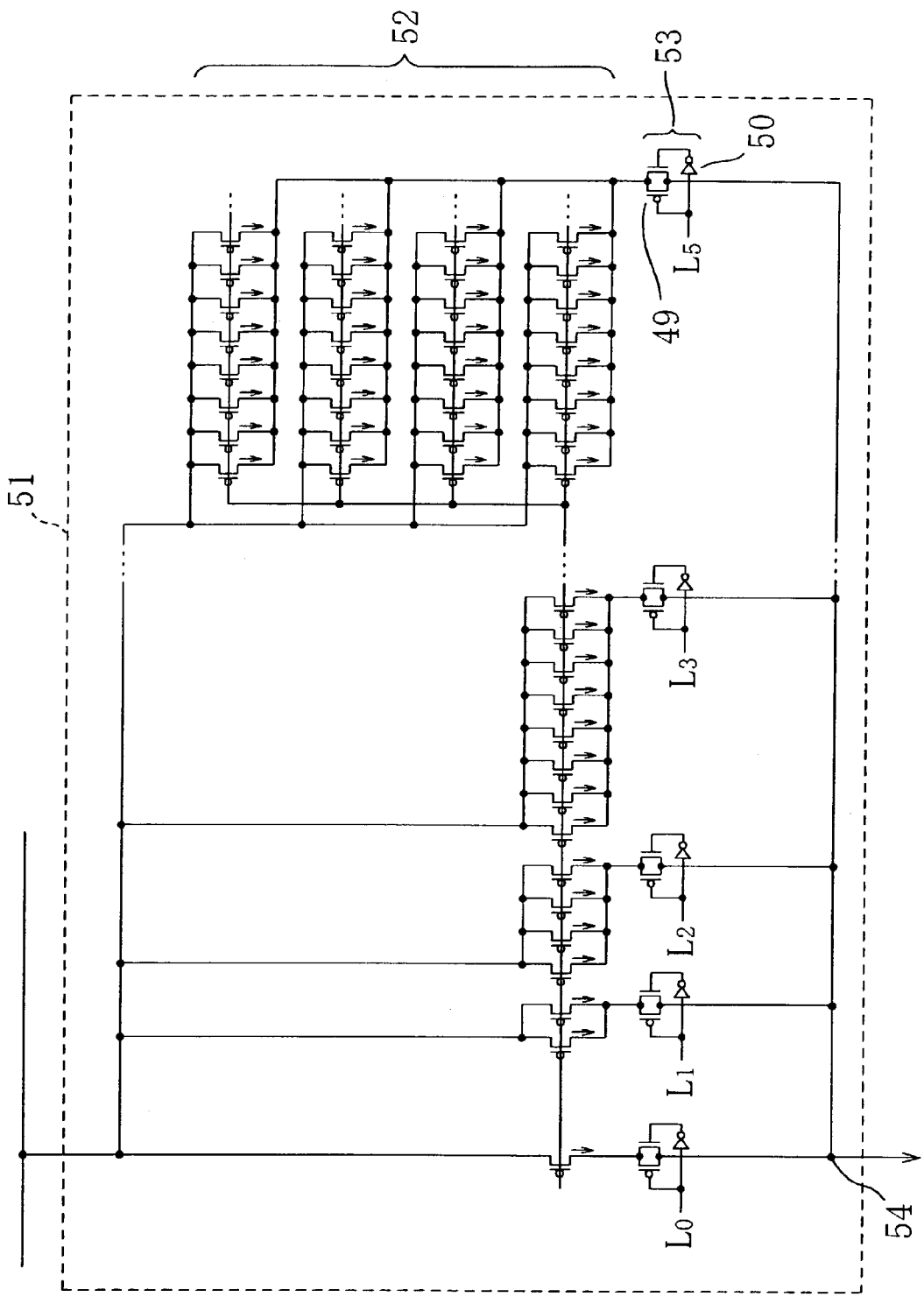
FIG. 6 is a view showing a detailed configuration of a gray scale control circuit shown in FIG. 5.

FIG. 5 is a circuit diagram showing the configuration of an output circuit (current driver) for gray scale control according to a fifth embodiment of the present invention; and FIG. 6 is a view showing a detailed configuration of the gray scale control circuit 51 shown in FIG. 5.

As shown in FIG. 5, the output circuit for gray scale control according to the present embodiment includes a power-supply voltage supply unit 12; N gray scale control circuits 51 that are each connected to the power-supply voltage supply unit 12 and that each function as a current adding-type D/A converter; a first current supply unit 10a connected to the ground; a P-channel MISFET, namely, a first MISFET 11, that is provided between the first current supply unit 10a and the power-supply voltage supply unit 12 and that has drain and gate electrodes mutually coupled; a first node 18 provided between the first MISFET 11 and the power-supply voltage supply unit 12; a reception-side current mirror circuit 43 configured of a first mirror MISFET 43a and a second mirror MISFET 43b that are both N-channel MISFETs and that individually have gate electrodes mutually coupled; a fourth P-channel MISFET 41 that has a drain connected to the first mirror MISFET 43a, a gate electrode connected to the gate electrode of the first MISFET 11, and a source connected to the power-supply voltage supply unit 12 and that constitutes a transmission-side current mirror together with the first MISFET 11; a P-channel MIS transistor, namely, a MISFET for tilted-bias 30 that has a source connected to the second mirror MISFET 43b and that has drain and gate electrodes mutually coupled; a gate bias supply line 15 that mutually connects the gate electrode of the first MISFET 11 and the gate electrode of the MISFET for tilted-bias 30; a power-supply voltage supply wire 4 for supplying the power-supply voltage to the individual output circuits for gray scale control 51; a power-supply voltage supply node 17 that is provided to the power-supply voltage supply wire 4 and that is connected to the individual output circuits for gray scale control 51; and resistors 13 individually provided between the power-supply voltage supply nodes 17 and between the power-supply voltage supply node 17 and the first node 18.

In addition, as shown in FIG. 6, the gray scale control circuit 51 includes a plurality of current-adding current mirror units 52 having sources connected to the power-supply voltage supply node 17 and parallel connected to one another; selecting switches 53 that are individually provided on the sides of drains of the current-adding current mirror units 52 and that individually have output sides coupled to one another; and an output unit 54 for supplying an output current.

In addition, the current-adding current mirror units 52 are constituted of P-channel MISFETs parallel connected to one another; and in the case of the 6-bit gray scale (64 gray scales), they are individually constituted of 1, 2, 4, 8, 16, and 32 P-channel MISFETs. The selecting switch 53 includes a transfer gate unit 49 formed of an N-channel MISFET and a P-channel MISFET, and an inverter 50 of which an output side is connected to the N-channel MISFET. The individual selecting switches 53 are sequentially controlled in terms of ON/OFF operations in accordance with digital data $L_0$, $L_1$, ..., and $L_5$. The MISFETs constituting the current-adding current mirror units 52 are mutually homogenized in electric characteristics; therefore, when the selecting switch 53 is ON, currents that are identical to one another flow to the individual P-channel MISFETs of the current-adding current mirror unit 52.

According to this configuration, in the output circuit for gray scale control according to the present embodiment, currents of 64 different magnitudes can be supplied from the output unit 54. In addition, as described in the fourth embodiment, variations in the current amounts output from the output unit 54 are reduced between the output circuits for gray scale control 51. As such, with the output circuit for gray scale control according to the present embodiment, gray scale control can be implemented for a panel using current-driven light emitting devices, such as organic EL devices, inorganic EL devices, or LEDs, and concurrently, suppression of display variations can be implemented. Further, a printer producing less print variations can be realized by using the output circuit for gray scale control according to the present embodiment for a head of the printer using the aforementioned light emitting devices.

Further, in the output circuit for gray scale control according to the present embodiment, since operational amplifiers requiring a relatively large area need not be provided, the chip size can be reduced to be smaller in comparison to the current driving output circuit for gray scale control or voltage driving output circuit for gray scale control of the type using operational amplifiers.

In the above description, the example of the output circuit for gray scale control for implementing 64 gray scales is shown. In order to implement a gray scale display of n bits (M gray scales; $M=2^n$), it is sufficient to provide the current-adding current mirror unit 52 including M/2 pieces of MISFETs to one gray scale control circuit 51. In this case, M represents a positive even number. For example, a gray scale display of 128 gray scales can be implemented by further providing the current-adding current mirror unit 52 including 64 P-channel MISFETs to the gray scale control circuit 51 of the present embodiment.

In the present embodiment, the gray scale display is implemented according to the number of the MISFETs used in the current-adding current mirror unit 52. However, the arrangement may be such that one MISFET is used in units of the number of bits, and the values of gate width (W)/gate length (L) thereof are set to 1, 2, 4, ..., and 32. However, the accuracy of the output current is higher when the gray scale control is performed in accordance with the number of MISFETs.

Thus, in the output circuit for gray scale control according to the present embodiment, an organic EL panel producing less luminance variations can be implemented by providing the current adding-type D/A converters in place of the gray scale control units 1 of the output circuit for gray scale control described in each of the first to fourth embodiments.

In the output circuit for gray scale control according to the present embodiment, N-channel MISFETs may be used as the MISFETs constituting the current-adding current mirror unit 52.

In the output circuit for gray scale control according to the present embodiment, in a case where the gray scale control units 1 used in the second embodiment is provided to replace the gray scale control circuits 51, the circuit becomes a voltage driver usable for a display panel or the like.

Embodiment 6

An output circuit for gray scale control according to a sixth embodiment of the present invention is a current driver having four features described hereunder.

A first feature is that multistage current mirror units are provided, and inter-output-current inhomogeneities are thereby reduced.

A second feature is that means is provided to compensate for the difference between of luminance control imparted to a display apparatus and luminance characteristics actually displayed.

A third feature is that a selective precharge circuit (not shown) for supporting precharging of a parasitic capacitance occurring in signal lines of the display apparatus and a selective precharge control circuit 62 are provided.

A fourth feature is that a current increment control circuit 61 for incrementing the output current is provided.

Figure 9:
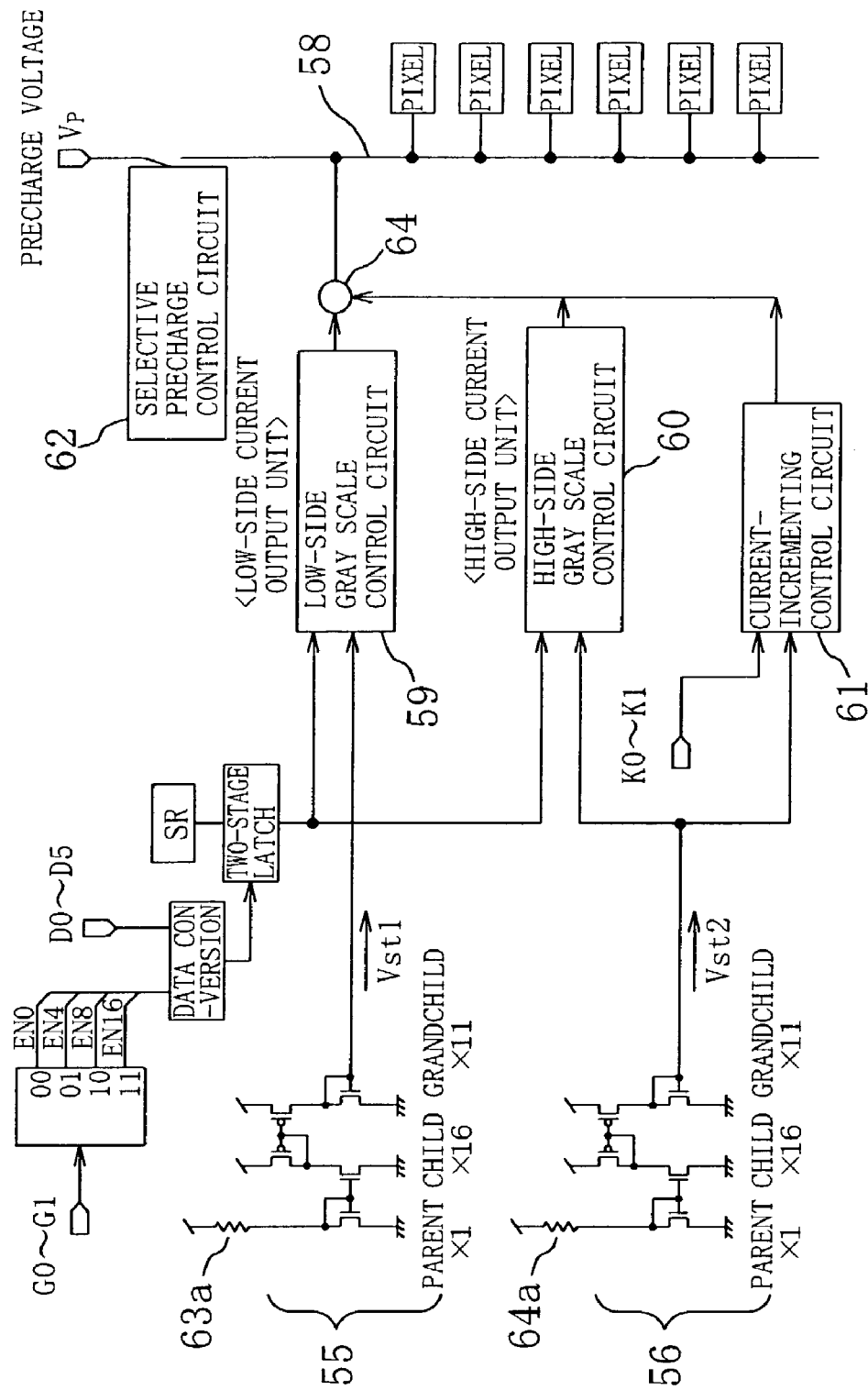
FIG. 9 is a block circuit diagram showing a current-drive-scheme employed display apparatus using an output circuit for gray scale control according to a sixth embodiment of the present invention.

FIG. 9 is a block circuit diagram showing the configuration of a current-drive-scheme employed display apparatus using an output circuit for gray scale control according to a sixth embodiment of the present invention.

As shown in the figure, the output circuit for gray scale control according to the present embodiment includes a low-side current output unit 59 for controlling 1 to 4, 8, and 16 gray scales; a low-side current mirror unit 55 for supplying a reference voltage Vst1 to the low-side gray scale control circuit 59; and a high-side current output unit; and in addition, it includes a high-side gray scale control circuit 60 for controlling 4, 8, and 16 to 64 gray scales; a current increment control circuit 61 connected to an output unit 64; a high-side current mirror unit 56 for individually supplying a reference voltage Vst2 to the high-side gray scale control circuit 60 and the current increment control circuit 61; and the selective precharge control circuit 62 connected to a display-side source signal line 58.

Although not shown in FIG. 9, the low-side current mirror unit 55 and the high-side current mirror unit 56 each have a 3-stage configuration having 176 outputs. The first stage of the low-side current mirror unit 55 and a first stage (parent current source) are coupled to external resistors 63a and 63b, respectively.

Further, a current created by addition of an output current from the current increment control circuit 61 to output currents from the low-side current output unit and the low-side current output unit is supplied to the display panel side.

Hereinafter, the features of the output circuit for gray scale control according to the present embodiment will be described. However, the incrementing circuit will be described later in the embodiment discussed below.

Multistage Current Mirror Units

To maintain constant-current characteristics of the current mirror circuit, the number of the mirror transistors connected to the common voltage supply line needs to be limited (voltage distribution scheme). This is because with an increased number of the mirror transistors, the voltage-drop influence in the voltage supply line is increased, as already described above.

On the other hand, the current driving output circuit for gray scale control includes many outputs similarly to the voltage driving output circuit for gray scale control. The number of outputs in the output circuit for gray scale control according to the present embodiment is 176 for each of the colors R (red), G (green) and B (blue); that is, 528 in total. When supplying the power-supply voltage from the common voltage supply line to a current mirror corresponding to the 176 outputs, an inter-output-current inhomogeneities can unexpectedly occur. As such, the current delivery scheme that interconnects current mirrors is employed. In this case, however, since current consumption increases when the number of current distributions is increased, there occurs a tradeoff with the product performance. For this reason, the present inventors have employed a multistage structure for the current mirror unit by using the current delivery together with and the voltage distribution scheme.

Figure 7:
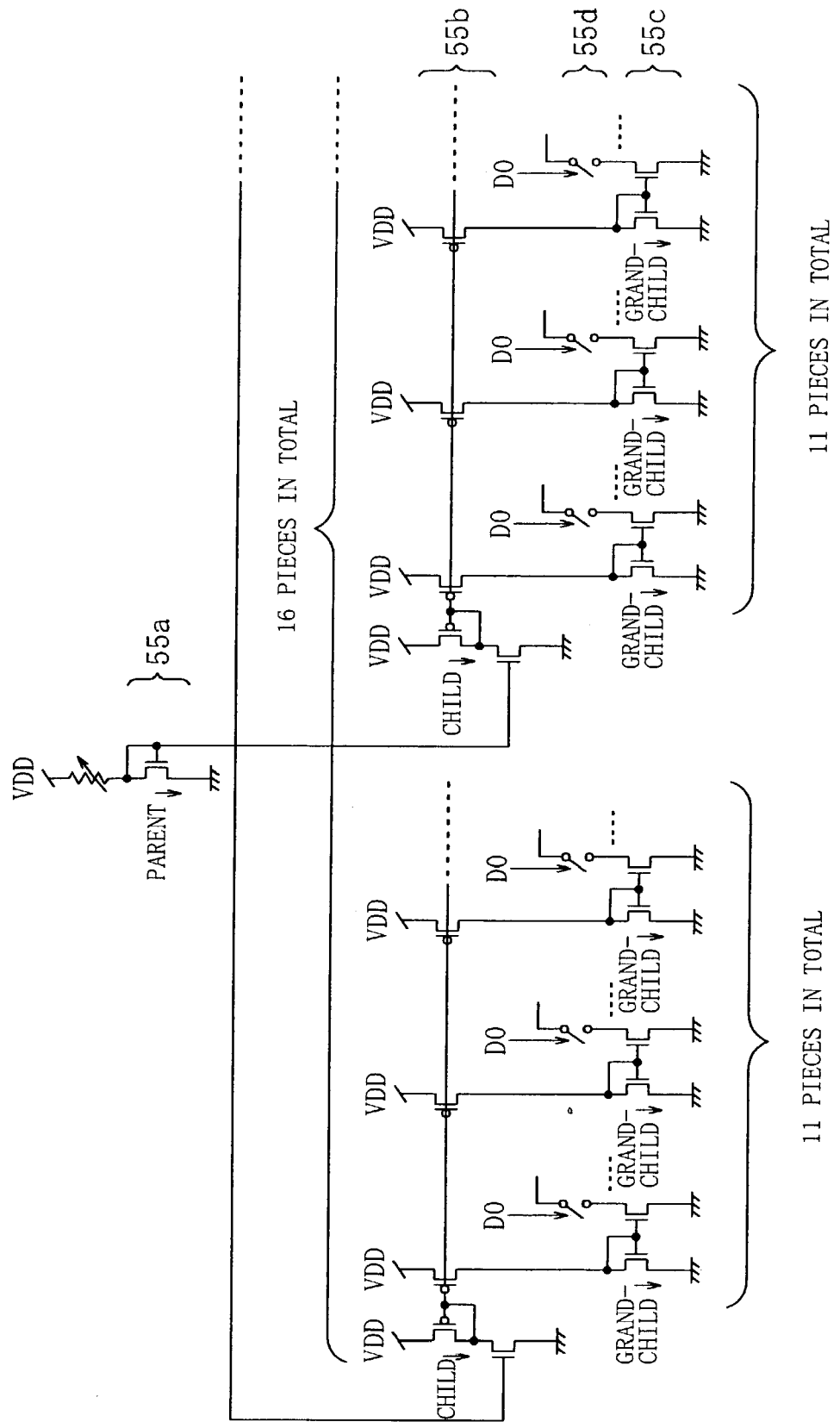
FIG. 7 is a view showing a multistage current mirror unit in a case where a three-stage current source is employed.

FIG. 7 is a view showing a multistage current mirror unit in a case where a three-stage current source is employed.

As shown in the figure, a current value of a first stage current mirror (parent current source 55a) is copied by a current mirror circuit into 16 second stage current mirrors (child current sources 55b). Also, a current value of the child current source 55b is copied by the current mirror into 11 third stage current mirrors (grandchild current sources 55c). Thus, currents of mutually same magnitudes are distributed to MISFETs constituting the current mirror. According to the configuration described above, the current value of the parent current source 55a is transferred to 176 (16×11=176) grandchild current sources 55c. According to this configuration of the current mirror unit, variations in the output current value from the parent current source 55a can be reduced to be less than in the case where the current value of the parent current source 55a is directly transferred to the 176 grandchild current sources 55c. As such, display variations can be reduced in the case where the multistage current mirror is used in, for example, an organic EL display.

Since the output circuit for gray scale control according to the present embodiment includes the multistage current mirror units each having the 3-stage configuration, variations in the reference voltages Vst1 and Vst2 to be inputted to the individual low-side gray scale control circuits 59 are reduced. Accordingly, also variations in output currents from the individual low-side current output unit and high-side current output units are reduced.

The number of stages of the current mirror unit may be three or lager, and the number of the outputs may be appropriately changed.

Approaches to γ Correction

The luminance of a light emitting device used for a display is not always increased proportionally to an applied voltage. The increase ratio of the current to the luminance is higher when the applied voltage is larger than when the applied voltage is small. This is called γ characteristics, which can be observed also in liquid crystal.

Figure 8:
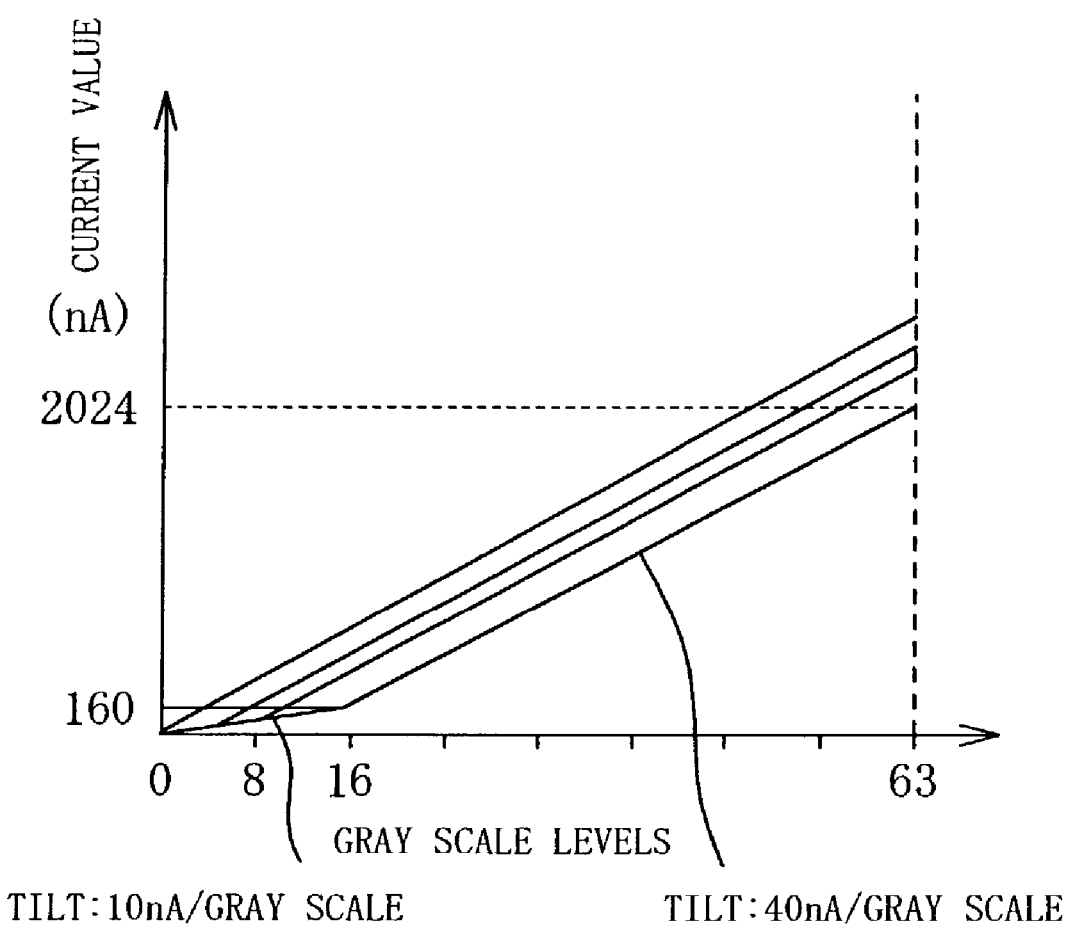
FIG. 8 is a view showing gray scale level-output current characteristics of the current that is output by the current driving output circuit for gray scale control.

FIG. 8 is a view showing gray scale level-output current characteristics of currents output by the current driving output circuit for gray scale control.

In the current driving output circuit for gray scale control, since the gray scale is controlled through the combination of unit current sources using the current mirrors, when one current mirror for performing the gray scale control is used, a gray scale level vs. output current power graph is formed linear. As such, a case can occur in which the luminance of the light emitting device deviates from the setting.

In order to solve the problem, the present inventors arranged the configuration such that current mirror units and gray scale control circuits of the output circuit for gray scale control for use with a display apparatus is separated into the two sides, namely, the low side and the high side, in which the current is output only from the low-side current output unit when the output current is small, and the current from the high-side current output unit is added to the current output from the low-side current output unit.

In the output circuit for gray scale control according to the present embodiment, the output current from the low-side gray scale control circuit 59 which is capable of independently controlling the gray scale in a range of 1 to 16 levels is output at all times from the output unit 64, whereas the output current from the high-side gray scale control circuit 60 which is capable of controlling 4, 8, 16, 32 and 64 gray scales is output from the output unit 64 only when 16 gray scales are exceeded.

Consequently, as shown by arrows in FIG. 8, the characteristics of the output current is controlled to be close to the γ characteristics of the light emitting device. In the example of the present embodiment, tilts of the gray scale level vs. output current power graphs are 10 nA/gray scale in the region of 16 or less gray scales and 40 nA/gray scale in the region of more than 16 and up to 64 gray scales.

On/off operations of switch circuits in the low-side gray scale control circuit 59 and the high-side gray scale control circuit 60 are controlled by γ correction control signals G01 to G1 and video data D0 to D5 that are applied via a data conversion circuit and a two-stage latch.

The above enables gray scale control to be implemented in compliance with settings in the case where the output circuit for gray scale control according to the present embodiment is used for the organic EL panel or the like.

The output circuit for gray scale control for which the above-described measures for the γ correction are taken can be used for display apparatuses using not only organic EL devices but also light emitting devices such as inorganic EL devices and LEDs. Further, the circuit can be used for printer heads using these light emitting devices.

While FIG. 9 shows the example of the current driving output circuit for gray scale control only for a single color, light emitting device such as organic EL devices, inorganic EL devices, and LEDs have different γ characteristics depending on the R, G, and B colors. As such, it is preferably that multistage current mirror units having different output characteristics for the individual R, G, and B colors are provided.

In the output circuit for gray scale control according to the present embodiment, the gray scale-output current characteristics are controlled to be close to the γ characteristics by combining current mirror units having linear characteristics different from each other. An approximation with even higher accuracy can be realized by combining three or more sets of the multistage current mirrors and gray scale control circuits.

Selective Precharge Control Circuit

As shown in FIG. 24, in the organic EL panel, many P-channel TFTs formed of, for example, low-temperature polysilicon, are arrayed. In this panel, when the voltage $V_O$ taken from the panel into the side of the output circuit for gray scale control is increased, a large current flows also to the TFT and the organic EL device; therefore, the luminance of the organic EL device increases. At this time, a white color is displayed.

In contrast, when the drain voltage is increased, since the current decreases, a black color is displayed. At this time, to increase the drain voltage, the potential of the source signal line 58 needs to be increased up to the vicinity of the potential of the panel.

However, the panel signal line has a large parasitic capacitance, and the parasitic capacitance needs to be charged to perform the black display. However, the mobility of the low-temperature polysilicon is one decimal place lower than that of silicon crystal, and the current capacity is small, thereby making it difficult to perform a quick black display.

Although increasing the W/L ratio of the TFT enables the current capacity to be improved, since the TFT in the pixel is disposed over the display pixel, when the W/L ratio is increased, a defect occurs in that the display apature ratio is reduced.

To solve the above, as a result of researches, the present inventors determined such that precharging is performed from the driving circuit side. That is, the selective precharge circuit and the selective precharge control circuit are provided in the output circuit for gray scale control to support the current capacity of the low-temperature polysilicon.

Figure 10:
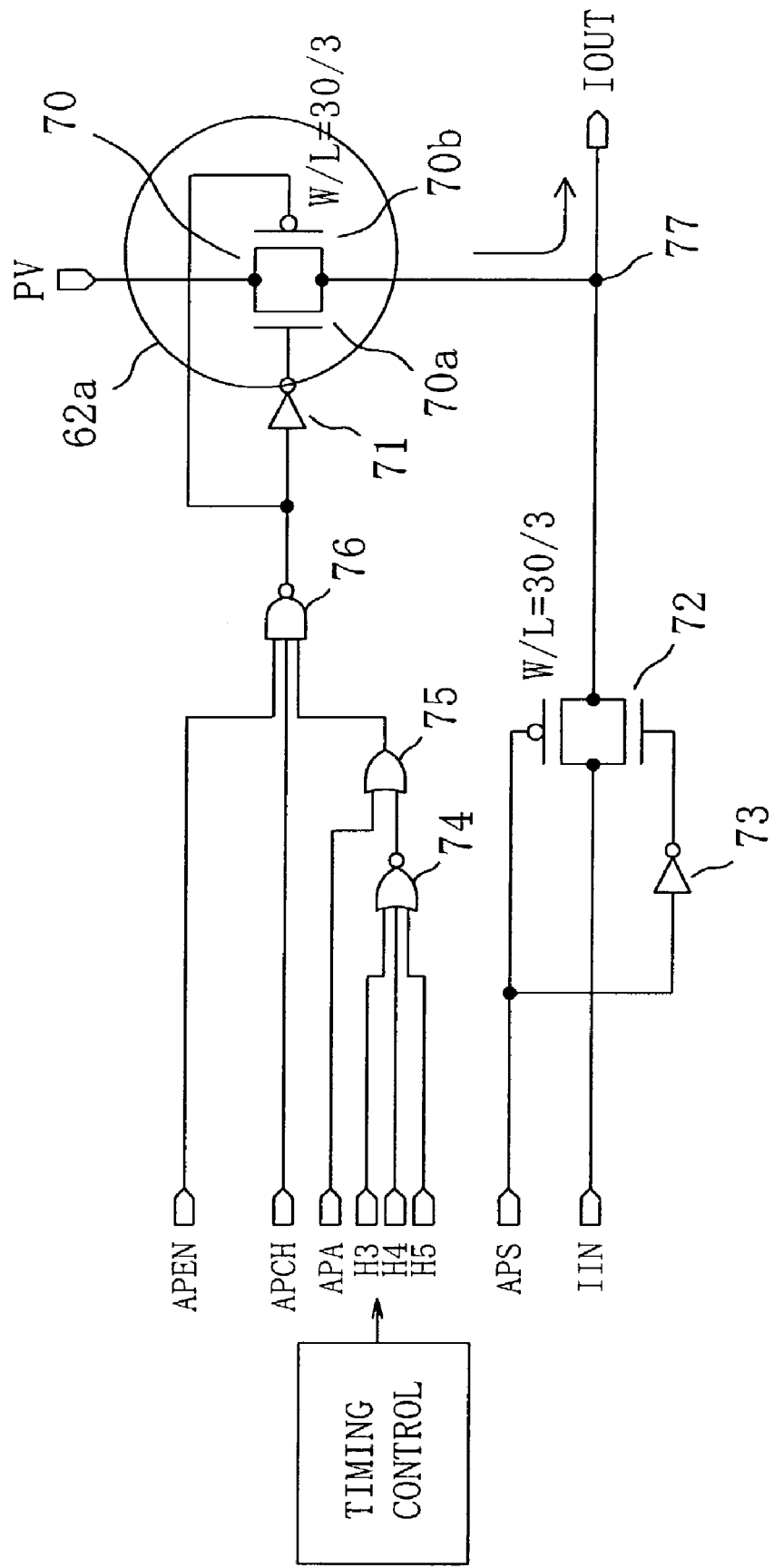
FIG. 10 is circuit diagram showing examples of a selective precharge circuit and a selective precharge control circuit in the output circuit for gray scale control according to the sixth embodiment.

FIG. 10 is circuit diagram showing examples of the selective precharge circuit and the selective precharge control circuit in the output circuit for gray scale control according to the present embodiment.

As shown in the aforementioned figure, a selective precharge circuit 62a according to the present embodiment includes a transfer gate 70 constituted of an N-channel MISFET 70a and a P-channel MISFET 70b and an inverter 71 having an output unit coupled to a gate electrode of the N-channel MISFET 70a and an input unit coupled to a gate electrode of the P-channel MISFET 70b. The source of the transfer gate 70 is connected to a power-supply voltage supply unit provided to supply a power-supply voltage PV, and the drain thereof is connected to the output unit of the gray scale control circuit via a current output node 77.

The selective precharge control circuit 62 includes, for example, a NOR circuit 74, an OR circuit 75, and a NAND circuit 76 that outputs a signal for controlling the selective precharge circuit 62a. The selective precharge circuit and the selective precharge control circuit are integrated into a chip as a part of the output circuit for gray scale control.

The selective precharge circuit 62a of the present embodiment is controlled for timing. It is controlled by the selective precharge control circuit 62 such that, when video data is in a range of, for example, 0 to 7, which is close to a black level, a voltage corresponding to the black level is output only in a predetermined initial time of one horizontal time. Thereby, when the video data is close to the black level, the parasitic capacitance of the source signal line 58 is precharged, thereby enabling quality of the black display can be improved.

In other time, since the transfer gate 70 is controlled to be off, the parasitic capacitance is not charged.

In addition, in the configuration using the selective precharge control circuit 62 and the selective precharge circuit 62a, when video data close to the black level is input, the precharging time can be selectively controlled. As such, redundant current consumption can be reduced, particularly, in a panel having a parasitic capacitance is relatively small.

The output circuit for gray scale control including the selective precharge control circuit 62 and the selective precharge circuit 62a can preferably be used to also control a panel including TFTs using amorphous silicon.

The above-described functions of the selective precharge control circuit 62 and the selective precharge circuit 62a are implemented regardless of the presence/absence of, for example, the low-side current mirror unit 55, the high-side current mirror unit 56, and/or the γ correction means. Further, the selective precharge control circuit 62 and the selective precharge circuit 62a are effective also for display apparatuses using light emitting device other than organic EL devices.

In the output circuit for gray scale control according to the present embodiment, even without the current increment control circuit 61, the selective precharge control circuit 62, and the selective precharge circuit 62a being provided, display variations of a display apparatus can be reduced with higher efficiency, compared to the conventional output circuit for gray scale control. However, the provision of the circuits described above enables image display with even higher accuracy.

Embodiment 7

As a seventh embodiment of the present invention, a description will be provided hereinafter regarding an output circuit for gray scale control (current driver) that has the same configuration as the output circuit for gray scale control according to the sixth embodiment and that is improved for the layout.

Figure 11:
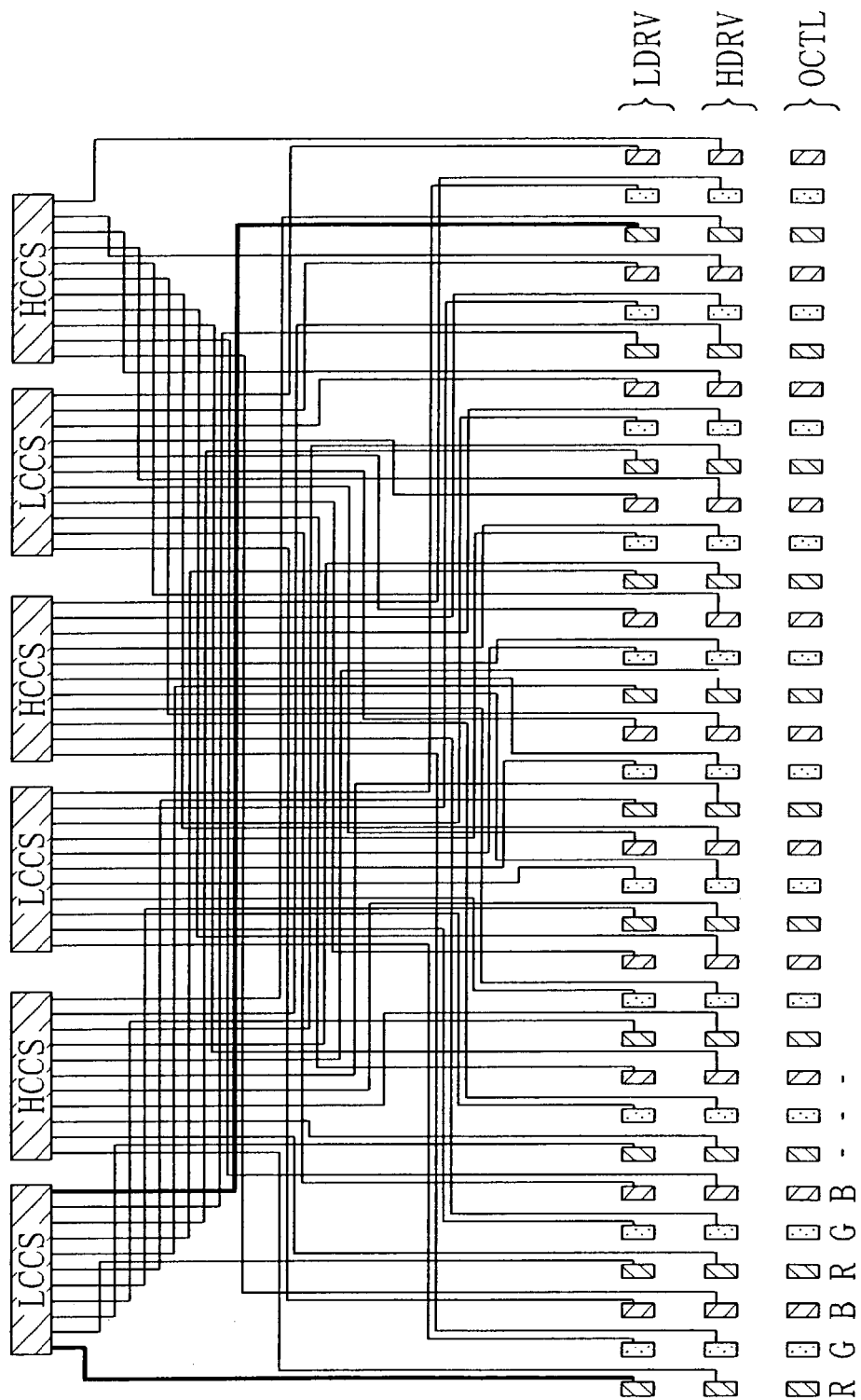
FIG. 11 is a view showing a reference example of a layout of the output circuit for gray scale control according to the sixth embodiment.
Figure 12:
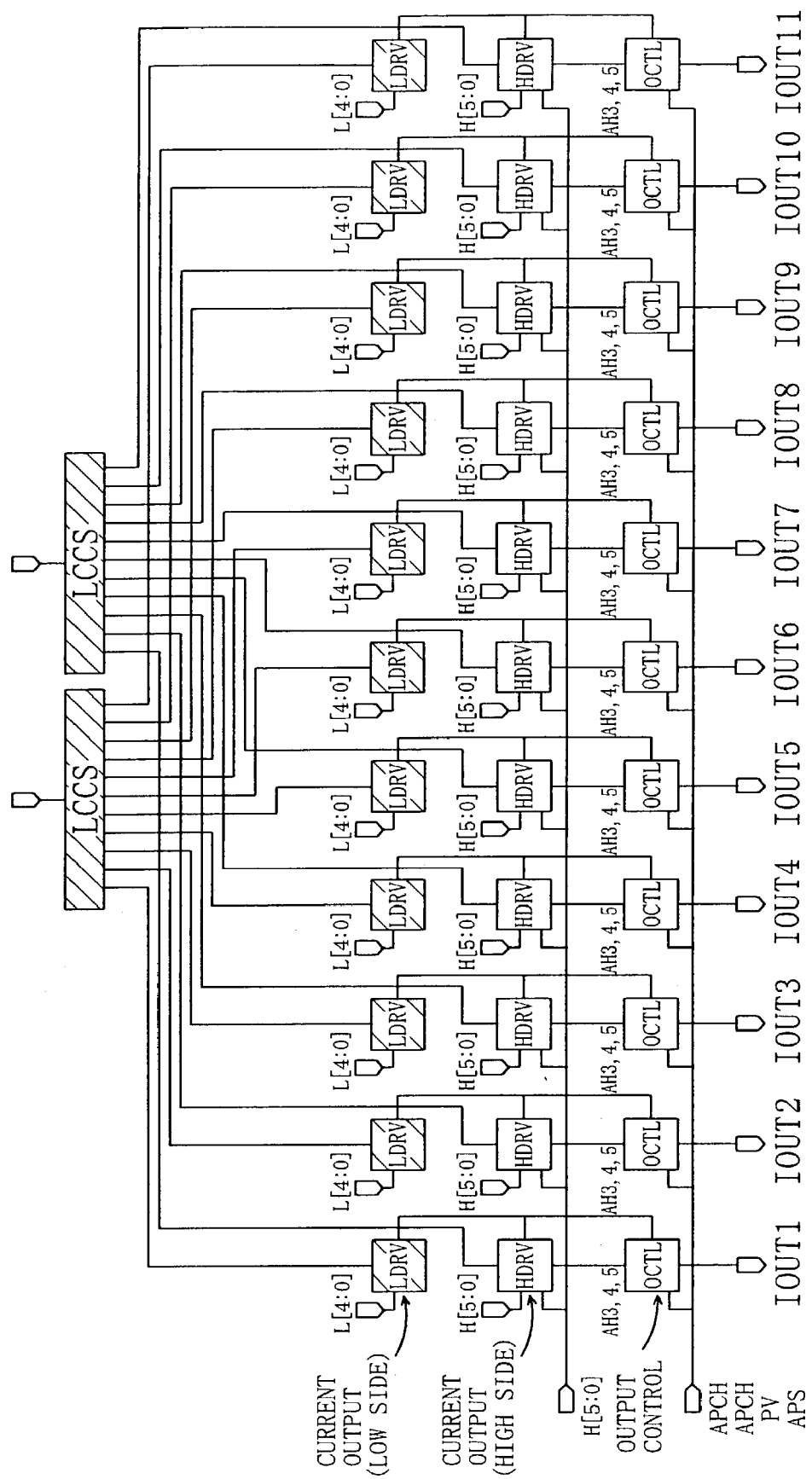
FIG. 12 is a view showing a layout of an output circuit for gray scale control according to a seventh embodiment of the present invention.

FIG. 11 is a view showing a reference example of the layout of the output circuit for gray scale control according to the sixth embodiment of the present invention. FIG. 12 is a view showing a layout of the output circuit for gray scale control according to the seventh embodiment of the present invention. Either FIG. 11 or FIG. 12 shows the example of the layout using double-layer wires.

An ordinary display-apparatus driver has a width of several millimeters. In this case, it is essential to reduce the circuit area in order to reduce the size of the peripheral side section of the panel for implementation of the reduction in the panel size. The present inventors conducted researches to improve the layout of the output circuit for gray scale control according to the sixth embodiment.

In the output circuits for gray scale control shown in FIG. 11 and FIG. 2, 16 pairs of a child (second stage) current source LCCS of the low-side current mirror unit and a child current source HCCS of the high-side current mirror unit are horizontally aligned in the order of uses for the R (red), G (green), and B (blue) colors. From each of the child current sources LCCS of the low-side current mirror unit, 11 wires extend toward low-side current output circuits LDRV; and from each of the child current sources HCCS of the high-side current mirror unit, 11 wires extend toward high-side current output circuits HDRV. In addition, wires extend toward output control circuits OCTL from each of the low-side current output circuits LDRV and high-side current output circuits HDRV.

The low-side current output circuit LDRV includes the grandchild current sources and the low-side gray scale control circuit 59 of the low-side current mirror unit 55 shown in FIG. 9; and the high-side current output circuit HDRV includes the grandchild current sources and the high-side gray scale control circuit 60 of the high-side current mirror unit 56 shown in FIG. 9. Further, the output control circuit OCTL includes, for example, the output unit 64 and the selective precharge control circuit 62.

As shown in FIG. 11, in the reference layout example, the low-side current output circuits LDRV, the high-side current output circuits HDRV, and the output control circuits OCTL are disposed in the order of R, G, B, R, G, B, . . . from the left side of the figure. According to this layout, as shown by right-side bold lines in FIG. 11, while there occur relatively short wires, there also occur very long wires. In addition, it can be known that the wires are intricately disposed with many crossovers therebetween.

In comparison, as shown in FIG. 12, in the layout according to the present embodiment, current output circuits and output control circuits connected to one pair of a R-dedicated child current source LCCS of a low-side current mirror unit and a child current source HCCS of a high-side current mirror unit are collectively disposed. In addition, high-side current output circuits HDRV and output control circuits OCTL are arrayed in a matrix, in which the low-side current output circuits are aligned along the first line, the high-side current output circuits HDRV are aligned along the second line, and the output control circuits OCTL are aligned along the third line.

According to the layout described above, very long wires as in the reference example shown in FIG. 11 can be avoided, and also crossovers between wires as shown therein can be reduced. Consequently, wire regions between the current mirror unit and the output control unit can be reduced.

Although only the R-dedicated members are shown in FIG. 12, arrays of grouped G-dedicated members and grouped B-dedicated members are continued in the lateral direction of the region shown in the figure.

Figure 13:
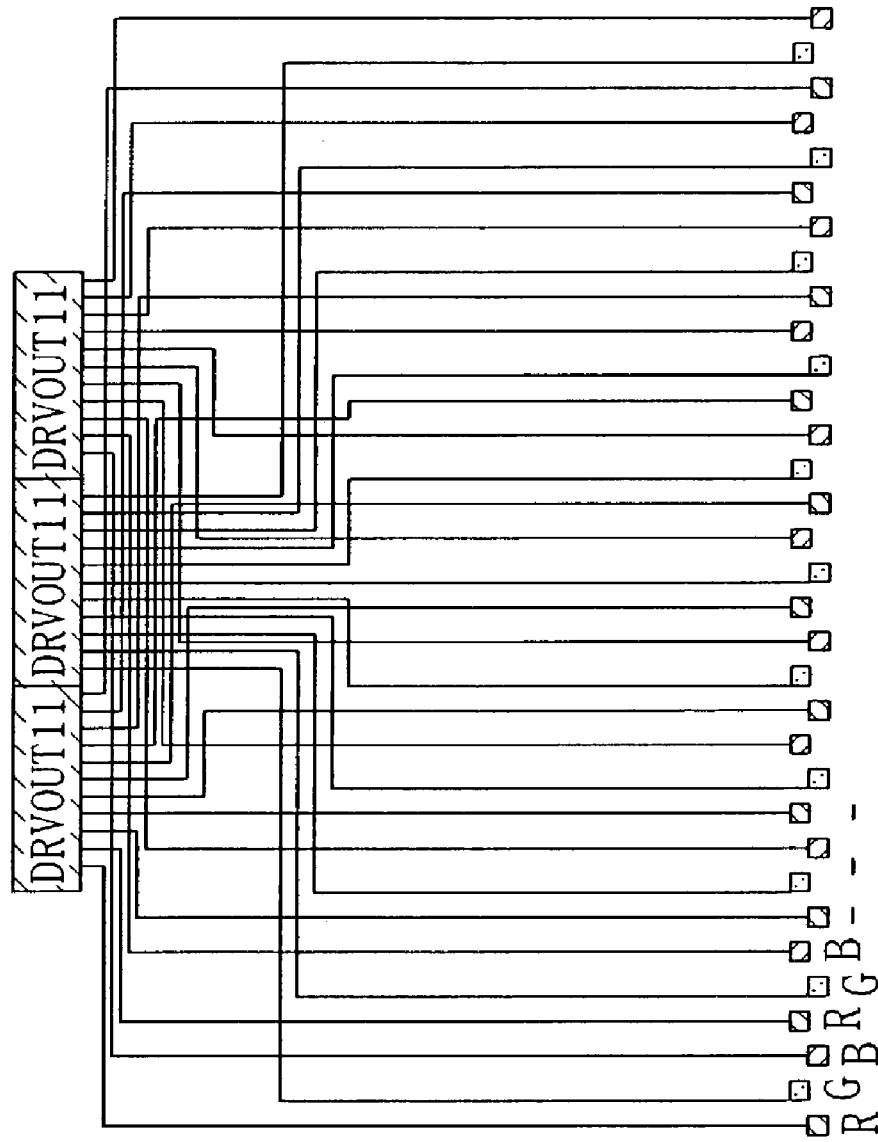
FIG. 13 is a wiring diagram showing an output wire region of the output circuit for gray scale control according to the seventh embodiment.

FIG. 13 is a wiring diagram showing an output wiring region of the output circuit for gray scale control according to the present embodiment.

As shown in the figure, in the case where the layout according to the present embodiment is applied, while wiring portions from the current mirror unit to the output control unit are reduced, wiring portions from output units (IOUT1 to IOUT11) of the output control circuits OCTL to output terminals for connection to the display panel become longer in comparison to the case of the above-described reference example.

Nevertheless, however, in the output circuit for gray scale control according to the present embodiment, while the current mirror units and the output control units are arranged to correspond in a relationship of 2:1, the output control units and the display panel are arranged to correspond in a relationship of 1:1. Hence, simplifying the wiring from the current mirror units to the output control units is a better choice and effective in view of the effectiveness of reducing the areas of wiring regions.

As such, according to the layout of the output circuit for gray scale control according to the present embodiment, when providing three or more current output circuits to perform the γ correction, the areas of wiring regions can be reduced even more effectively.

In the present embodiment, description has been given with reference to the example in which the total number of outputs is (176×3=528) per chip for R, G, and B. However, the layout according to the present embodiment may be applied to an output circuit for gray scale control with a different number of outputs.

In a case where the output circuit for gray scale control is used as a color-printer head, pixels to be driven may be required to be used for four or more colors. Even in this case, using of the layout according to the present embodiment enables a significant increase in the wiring area to be prevented.

Embodiment 8

As an eighth embodiment of the present invention, an example in which the gray scale control circuit 51 discussed in the fifth embodiment is improved for the layout will be described hereunder. The layout is applied as well to the low-side gray scale control circuit 59 and the high-side gray scale control circuit according to the sixth embodiment.

Figure 14A:
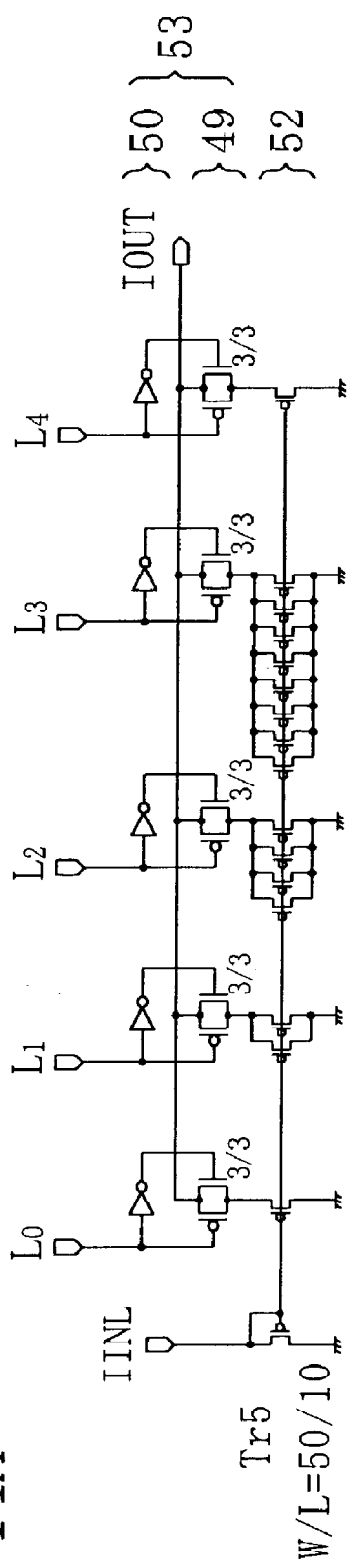
FIGS. 14A and 14B are, respectively, a circuit diagram showing a configuration of a gray scale control circuit and a view schematically showing a reference example of a layout of the gray scale control circuit.
Figure 14B:

FIGS. 14A and 14B are, respectively, a circuit diagram showing a configuration of a gray scale control circuit and a view schematically showing a reference example of a layout of the output circuit for gray scale control.

As shown in FIG. 14A, the gray scale control circuit 51 shown in FIG. 6 is constituted of the plurality of current-adding current mirror units 52 formed of P-channel MISFETs having same device configurations as one another, and the selecting switches 53 of which the number is same as that of the current-adding current mirror units 52 and that are connected to the individual current-adding current mirror units 52. The selecting switches 53 are each constituted of the transfer gate unit 49 formed of a P-channel MISFET and a N-channel MISFET, and the inverter 50. Outputs from all the selecting switches 53 flow to a common output unit IOUT via an output wire.

Since outputs of all the selecting switch 53 are concentrated into the output wire, a reduction in impedance of the output wire is essential to improve the accuracy of the output current.

In addition, as shown in FIG. 14B, in the reference example of the layout of the gray scale control circuit 51, the individual members are collectively disposed in a current mirror unit 52 (CM), a transfer gate 49 (TG), and an inverter 50 (IN). This layout offers an advantage in that masks can easily be produced in steps such as an impurity diffusion step and an etching step for a semiconductor chip into which the gray scale control circuits 51 are integrated.

However, as can be seen in FIG. 14B, the wire needs to be redundantly routed to collectively arrange devices located in remote positions as viewed in the circuit diagram. Since the width of the current driver used for the panel is several millimeters, the width of the output wire need to be reduced, and hence the output impedance of the gray scale control circuit 51 is unexpectedly increased because of the presence of the redundant wire routed in the direction opposite to the direction of the output wire.

The present inventors therefore tried to improve the circuit layout.

FIG. 15A is a circuit diagram showing a configuration of a gray scale control circuit, FIG. 15B is a view schematically showing a reference example of a layout of the gray scale control circuit, and FIG. 15C is a view schematically showing a gray scale control circuit according to the eighth embodiment.

As shown in FIG. 15C, in the layout of the gray scale control circuit of the present embodiment, the current-adding current mirror units 52, the transfer gate units 49 connected thereto, and the inverters 50 are collectively disposed in one set and are disposed in one row. That is, when the set of the current-adding current mirror units 52, the transfer gate units 49, and the inverters 50 is called a "gray scale generation unit", the gray scale generation units corresponding to the number of bets are aligned in one row.

According to the layout of the gray scale control circuit of the present embodiment, since the individual devices are disposed in accordance with the circuit configuration, a redundant wire as shown in FIG. 15B does not occur. Accordingly, the width of the output wire of the gray scale control circuit can be increased, and the output impedance of the gray scale control circuit can be reduced.

In addition, since redundant wires can be eliminated, and the wiring area can be reduced, the area of the chip into which the gray scale control circuits are integrated can be reduced.

The layout of the gray scale control circuit according to the present embodiment may also be applied to a gray scale control circuit of the type that performs gray scale control by changing the value of the gate width/gate length of the MISFETs.

Embodiment 9

Current Incrementing Circuit

Contrast adjustment for controlling the overall luminance to vary is employed as a technique for improving the display characteristics of the current-drive-scheme employed panel using light emitting devices.

A circuit for implementing the contrast adjustment corresponds to the current increment control circuit. Upon receipt of incrementing signals K0 to K1, The current increment control circuit is used to output currents that are output from the high-side gray scale control circuit 60 and the low-side gray scale control circuit 59.

For example, in the output circuit for gray scale control according to the sixth embodiment, incrementing currents from the current increment control circuit are input to the output unit 64. In this case, currents output from the output unit 64 are incremented for control of the all the gray scales.

However, the output-current incrementation needs to be performed for all outputs of the gray scale control circuits. Hence, there have been no ways than that the current increment control circuit 61 shown in FIG. 9 is connected to either the high-side current mirror unit 56 common to the high-side gray scale control circuit 60 or an additionally provided current mirror unit 65 for an increasing circuit.

FIGS. 16A and 16B are, respectively, a view showing current value-gray scale level characteristics of an output circuit for gray scale control shown in FIG. 16B and a block circuit diagram showing an example of an output circuit for gray scale control.

In each of the output circuits for gray scale control shown in FIG. 9 and FIG. 16, while effects of the current increment control circuit 61 are exhibited, the areas of wires and current mirror units are increased.

Output Circuit for Gray Scale Control According to the Present Embodiment

FIG. 17 is a view showing a current increment control circuit in an output circuit for gray scale control according to the ninth embodiment of the present invention.

The output circuit for gray scale control according to the present embodiment is used for, for example, a current driver for a display apparatus and a printer head.

The output circuit for gray scale control according to the present embodiment includes a low-side current output unit 59 connected to an output unit 64; a low-side current mirror unit 55 for supplying a reference voltage Vst1 to the low-side gray scale control circuit 59; a current increment control circuit 66 provided between the low-side current mirror unit 55 and the low-side gray scale control circuit 59; a high-side gray scale control circuit 60 connected to the output unit 64; a high-side current mirror unit 56 for supplying a reference voltage Vst2 to the high-side gray scale control circuit 60; and a selective precharge control circuit 62 connected to a display-side source signal line 58.

As shown in FIG. 17, the current increment control circuit 66 is constituted of current mirror units individually including one and two current mirrors and switching circuits for individually determining on/off in response to incrementing signals K0 to K1.

Since the current increment control circuit 66 has a configuration similar to that of the low-side gray scale control circuit 59, the manufacture thereof is easy, and current mirror units need not newly be provided. As such, the area of the output circuit for gray scale control according to the present embodiment can be significantly reduced in comparison to the output circuits for gray scale control shown in FIG. 9 and FIG. 16B.

The current increment control circuit 66 according to the present embodiment performs incrementation only for the output current of the low-side gray scale control circuit 59. However, since the output current of the low-side gray scale control circuit 59 is output at all times from the output unit 64, no defects are caused thereby. In addition, it is more important to perform incrementation for currents used to control low gray scales than to perform incrementation for currents used to control high gray scales.

Thus, according to the output circuit for gray scale control according to the present embodiment, increase in the area can be suppressed, and concurrently, the contrast adjustment can easily be implemented by using the current increment control circuit.

Embodiment 10

As a tenth embodiment, a method for testing each of the output circuits for gray scale control (current drivers) that have been described in the embodiments will be described hereunder.

The current per gray scale of the output circuit for gray scale control used for the current drive scheme is in a range of from 10 nA to 20 nA, the current value to be tested in testing is same thereas. As such, the very small test current output from the output circuit for gray scale control needs to be transferred to a semiconductor tester 79 without being attenuated.

In order to solve the above, the present inventors came to consideration that a detected current, which is a very small current, is transferred by converting it to a voltage.

Figure 18A:
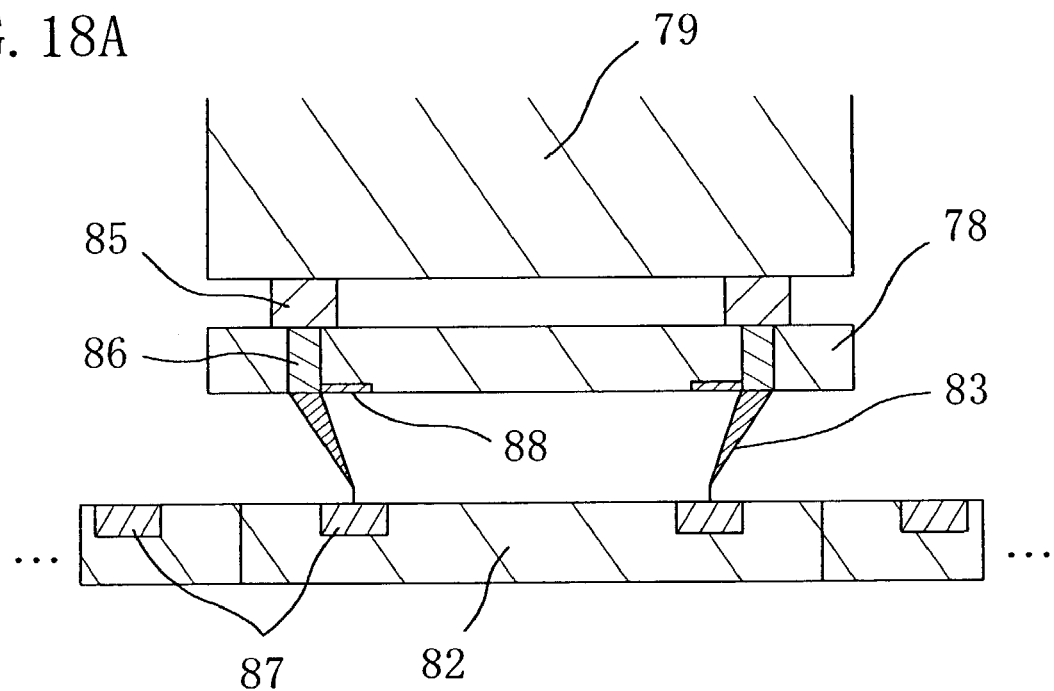
FIGS. 18A and 18B are, respectively, a cross-sectional view showing a probe card according to a tenth embodiment of the present invention and a block circuit diagram showing a cross section of the probe card.
Figure 18B:
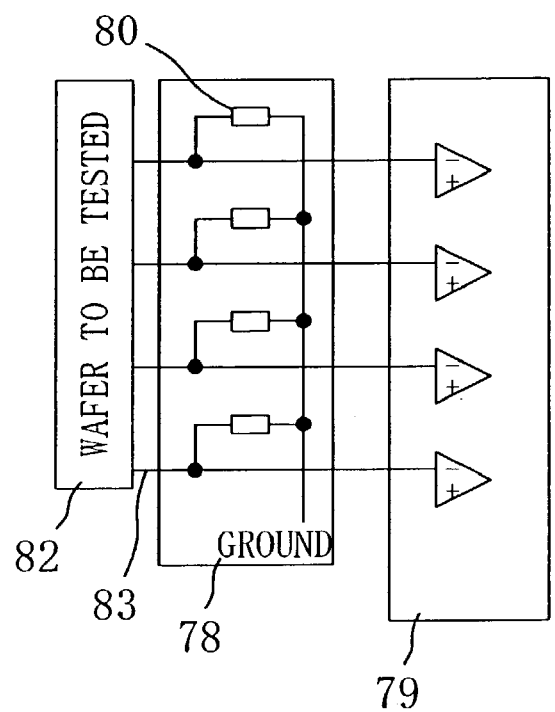

FIGS. 18A and 18B are, respectively, a cross-sectional view showing a probe card for testing the current driving output circuit for gray scale control, according to the tenth embodiment of the present invention and a block circuit diagram showing a cross section of the probe card.

As shown in FIGS. 18A and 18B, the probe card of the present embodiment includes a substrate 78 of which the upper surface is settable to the semiconductor tester 79, probes 83 provided on the undersurface of the substrate 78 and formed of a conductor, high-precision resistors 88 disposed within 10 cm from the roots of the probes 83 and coupled to the probes 83, and wires coupled to the resistors 88 and provided to pass through the substrate 78.

In addition, in a wafer to be tested 82, there are provided, for example, testing pads 87 (or bumps) and internal circuits (not shown) connected to the pads 87.

The semiconductor tester 79 includes comparators that each compare a testing signal output from the wafer to be tested 82 with a reference voltage.

Hereinafter, testing steps using the probe card of the present embodiment will now be in brief.

First, when performing the test, the substrate 78 is set to the substrate 78, and the probes 83 are set to contact the pads 87. In this state, currents having a predetermined value are input from the probes 83 to the pads 87 provided in the wafer to be tested 82.

Subsequently, current signals corresponding to the input currents are transferred from the pads 87 to the probes 83. At this time, as shown in FIG. 18B, the current signals are converted by resistors 80 individually disposed very close to the probes 83 into voltage signals. The voltage signals are transferred to the semiconductor tester 79 via, for example, the substrate 78, wires 86, connection wires 85, and jigs (not shown).

Subsequently, the voltage signals input to the semiconductor tester 79 are compared with the predetermined reference voltage. At this time, if the difference between the voltage signal and the reference voltage falls within a predetermined range, the product is determined to be "acceptable".

Generally, compared to a current signal, a voltage signal is not attenuated easier through transfer paths. Hence, with the probe card of the present embodiment, the signals from the wafer to be tested can be securely transferred to the semiconductor tester 79 in the way that the current signals received from the wafer to be tested 82 are converted by the resistors 80 into the voltage signals. However, in the probe card of the present embodiment, since a signal path passing through the resistor 80 has a large impedance, the path is preferably provided with a shielding device not to be influenced by disturbance noise.

In the probe card of the present embodiment, the distance between the probe 83 and the resistor 80 is preferably approximately 10 cm or shorter. This is because the current signal may probably be attenuated in the course up to the resistor 80 when the distance between the probe 83 and the resistor 80 is excessively long.

In addition, the probe card described herein is of a type for testing wafers in units of a chip. However, even with a probe card for wafer burn-in, a wafer including the output circuit for gray scale control can be tested by providing high-precision resistors in portions very close to the probes.

The wafer to be tested is not limited to the one including the output circuit for gray scale control, but any wafer may be similarly tested with the probe card of the present embodiment as long as the wafer is of a type in which a circuit including a function of detecting a very small current is provided.

As the resistors 88 disposed in the probe card of the present embodiment, integrated resistors may be used.

Embodiment 11

In the test using the probe card of the tenth embodiment, when the range of voltages to be tested is significantly variable, a case can occur in which a voltage value of a voltage signal is out of a detection range of the semiconductor tester 79. To avoid such a case, the present inventors made researches for further improving the construction of probe card.

Figure 19:
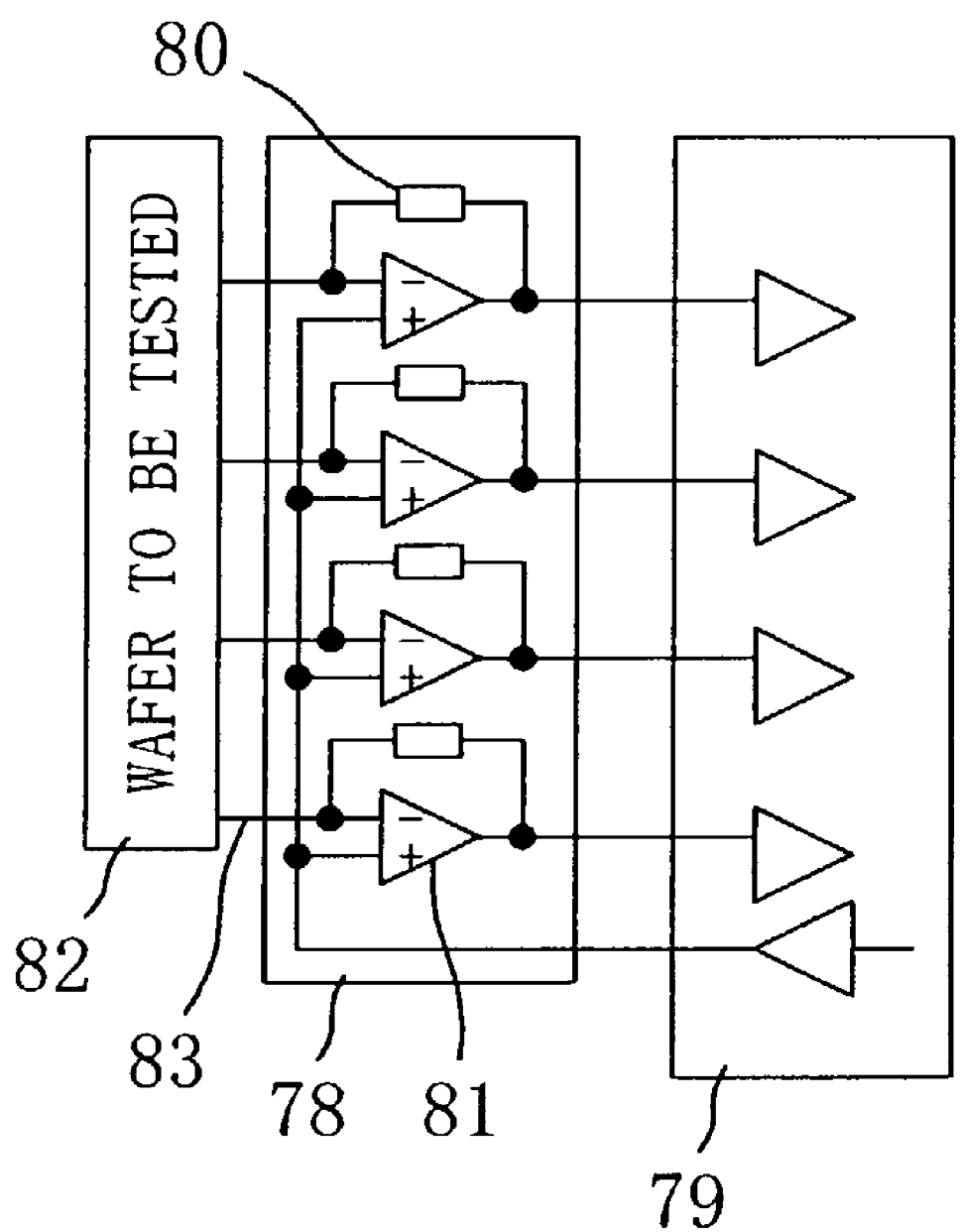
FIG. 19 is a block circuit diagram showing a cross section of the probe card according to an eleventh embodiment of the present invention.

FIG. 19 is a block circuit diagram showing a cross section of a probe card according to an eleventh embodiment of the present invention.

The probe card of the present embodiment includes a substrate 78; probes 83 provided on the undersurface of the substrate 78; high-precision resistors 80 individually disposed very close to the probes 83 on the undersurface of the substrate 78 and set to resistance values; comparators 81 that are provided on the undersurface of the substrate 78 and that each have an output unit coupled to one end of the resistor 80 and a negative-side input unit coupled to the other end of the resistor 80; and wires provided to pass through the substrate 78. In the testing time, a reference voltage signal is supplied from the semiconductor tester 79 to a positive-side input unit of each of the comparators 81. In this case, as operational amplifiers, those having high impedance are preferably used.

The probe card of the present embodiment includes the operational amplifiers 81 in each of which the reference voltage negatively fed back in the resistor 80 is input to the positive-side input unit. A gain (output voltage)/(input voltage) of the negatively fed back voltage input to the positive-side input unit of the operational amplifiers 81 is defined by a feedback ratio of the resistor 80. Hence, the range of the signal voltage can be caused to fall within a detectable range of the comparator of the semiconductor tester 79 by changing the reference voltage signal corresponding to the magnitude of the input signal voltage. More specifically, when a signal current from the wafer to be tested 82 is small, a low reference voltage signal is input to the positive-side input unit of the operational amplifiers 81; and when the signal current is large, a high reference voltage signal is input to the positive-side input unit of the operational amplifiers 81. As the operational amplifiers, those having sufficiently high impedance are used.

In this manner, in the probe card of the present embodiment, the range of the signal voltage to be detected can be controlled by changing the reference voltage signal corresponding to the magnitude of the signal current from the wafer to be tested 82. Thereby, the test can easily be performed with high accuracy.

Since the operational amplifiers 81 to be provided to the probe card of the present embodiment lead to a problem depending on the sizes thereof, those integrated into a chip are preferably used.

Embodiment 12

As a twelfth embodiment, a circuitry which is provided on a chip and in which a resistor for converting a current signal into a voltage signal is mounted will be described hereunder.

Figures 20A, 20B:
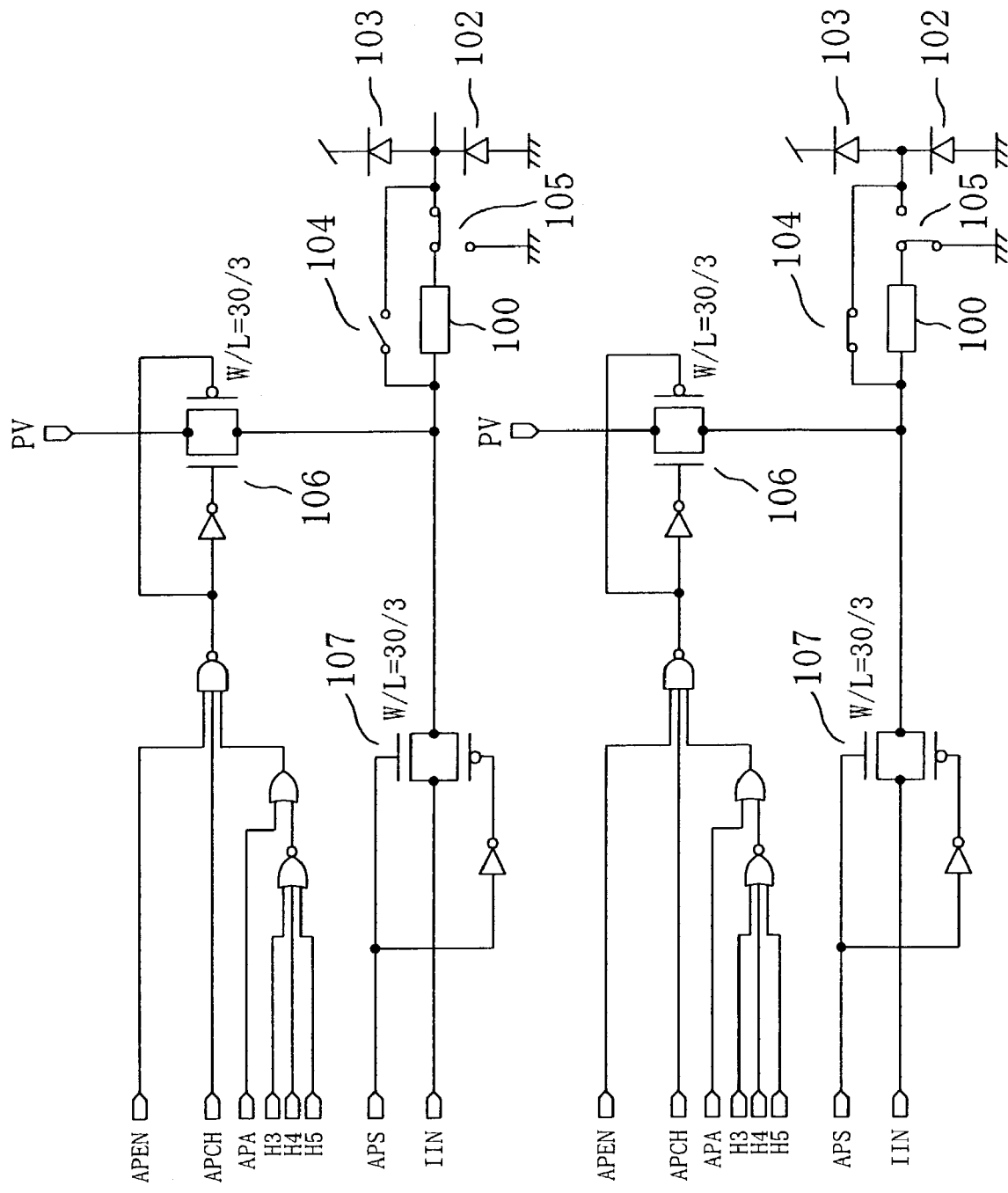
FIGS. 20A and 20B are, respectively, a circuit diagram showing a semiconductor chip according to a twelfth embodiment of the present invention in a normal time and a circuit diagram of the semiconductor chip according to the twelfth embodiment at a testing time.

FIGS. 20A and 20B are, respectively, a circuit diagram showing a semiconductor chip according to a twelfth embodiment of the present invention in normal time and a circuit diagram of the semiconductor chip according to the twelfth embodiment at testing time. In this case, the normal time including a normal operation time and a power cut time.

As shown in FIGS. 20A and 20B, the semiconductor chip of the present embodiment includes an integrated output circuit for gray scale control, a high-precision resistor 100 that is set to a resistance value and that is coupled to an output unit 107 of the output circuit for gray scale control and to a selective precharge circuit 106, diodes 102 and 103 for protecting internal circuits from an electrostatic discharge (ESD), switching circuits 104 and 105, and an external terminal (not shown).

The semiconductor chip of the present embodiment will be described in units of the operation time.

As shown in FIG. 20A, at the normal time (the power cut time and the normal operation time), the switching circuit 104 turns off, and the switching circuit 105 operates to cause the resistor 100 to be connected to the external terminal. At this time, the resistor 100 and the output circuit for gray scale control is series connected to one another.

Thereby, when a high voltage such as static electricity is applied from the external terminal, a voltage drop action of the resistor 100 enables the output circuit for gray scale control to be protected therefrom.

On the other hand, as shown in FIG. 20B, at the testing time, the switching circuit 104 turns on, and the switching circuit 105 operates to cause the resistor 100 to be connected to the ground.

Thereby, before a measuring current signal is outputted from the external terminal, the resistor 100 converts the current signal into a voltage signal.

As described above, according to the semiconductor chip of the present embodiment, the resistor 100 is used as an ESD protecting resistor in the normal time, and is used as a current/voltage conversion resistor in the testing time. Thereby, ESD protection is implemented, and a high-accuracy test can be executed. In addition, unlike the case of the eleventh embodiment, the provision of the resistor 100 in the semiconductor chip avoids the need for eliminates the need for providing the resistor to the probe card. As such, even a probe card of low-level quality can be used to test the output circuit for gray scale control.

Also in the case of the semiconductor chip of the present embodiment, the integrated internal circuit may be a circuit outputting a very small current, instead of the output circuit for gray scale control.

Further, the switching circuits 104 and 105 may be provided in positions different from those described in the present embodiment, and are sufficient if they are capable of switching the connection of the resistor between the testing time and the normal time.

Embodiment 13

A thirteenth embodiment of the present invention relates to a method for testing an output circuit for gray scale control (current driver).

Figure 21:
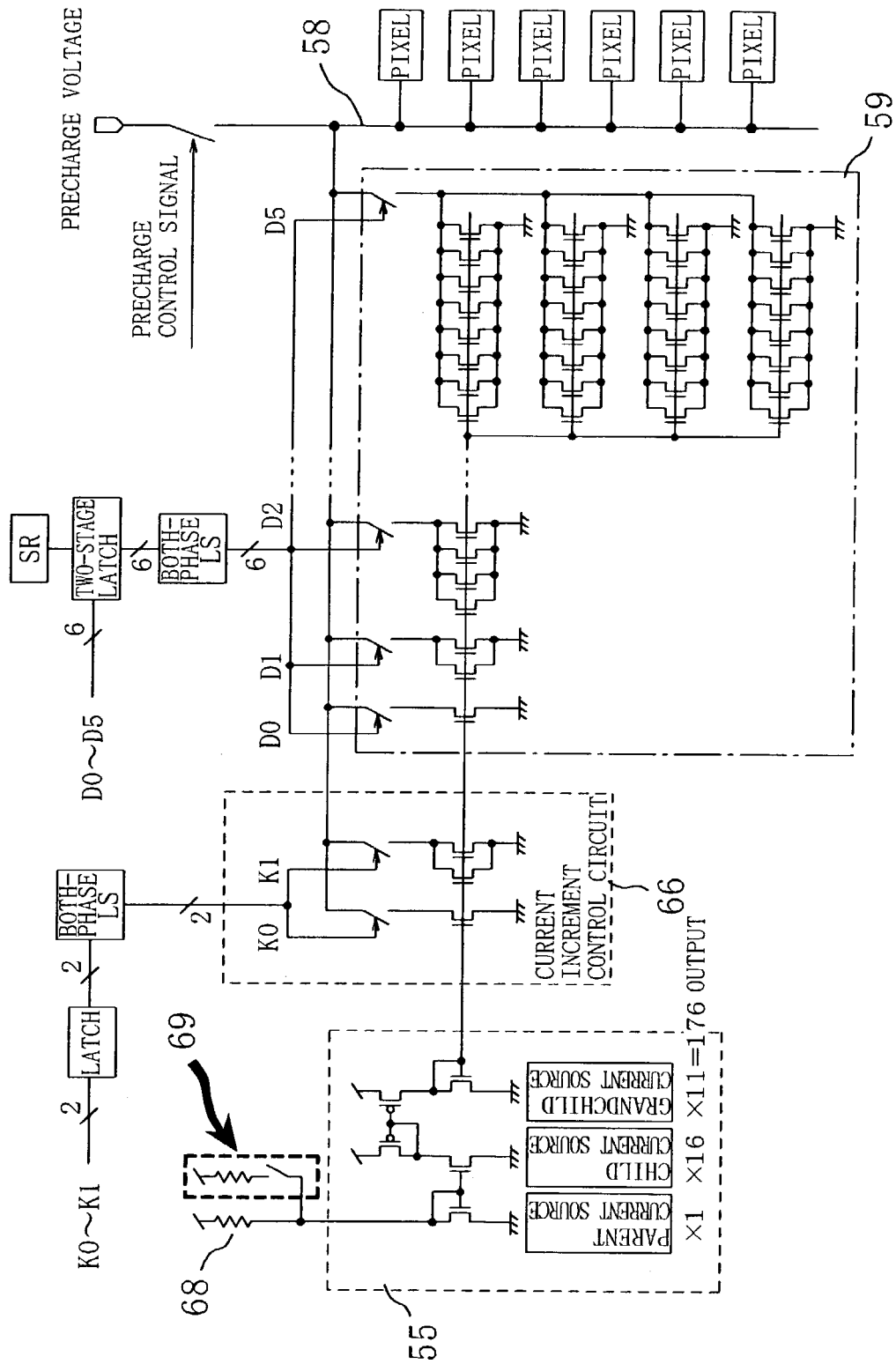
FIG. 21 is a circuit diagram used to explain a method for testing the output circuit for gray scale control, according to a thirteenth embodiment of the present invention.

FIG. 21 is a circuit diagram used to describe the method for testing an output circuit for gray scale control, according to the thirteenth embodiment of the present invention. Shown therein as an example output circuit for gray scale control is the output circuit for gray scale control according to the ninth embodiment shown in FIG. 17.

In the gray scale control circuit of the present invention, the magnitude of an output current from a gray scale control circuit is variable depending on the magnitude of a current supplied from a multistage current mirror. In a multistage current mirror used in the present embodiment, currents having the same value as a current flowing through one parent current source is supplied to 176 gray scale control circuits. Accordingly, when the current to be input to a multistage current mirror unit is increased, all currents to be output from all the gray scale control circuits connected to the multistage current mirror unit are increased.

In the method for testing the output circuit for gray scale control according to the present embodiment, a resistor 69 having a resistance value lower that of an external resistor 68 is used.

At the testing time, the resistor 69 is parallel connected with the external resistor 68 to a low-side current mirror unit 55.

At the normal time, using a switching circuit or the like, the connection is switched so that the resistor 69 is not connected to the low-side current mirror unit 55.

According to this manner, in the testing time, a current larger than that in the normal operation time temporarily flows, and a signal current to be output from the output circuit for gray scale control can thereby be increased to be, for example, 10 times larger. As a result, in the testing time, the influence of insulation resistance leaks due to parasitic devices and/or wire members can be reduced.

In the method for testing according to the present embodiment, while the example in which the resistor 69 is connected to the low-side current mirror unit 55 is shown, the resistor 69 may be connected to the high-side current mirror unit 56.

Embodiment 14

As a fourteenth embodiment, an example in which latch circuits are provided to inspect output circuits for gray scale control will be described hereunder.

Figure 22:
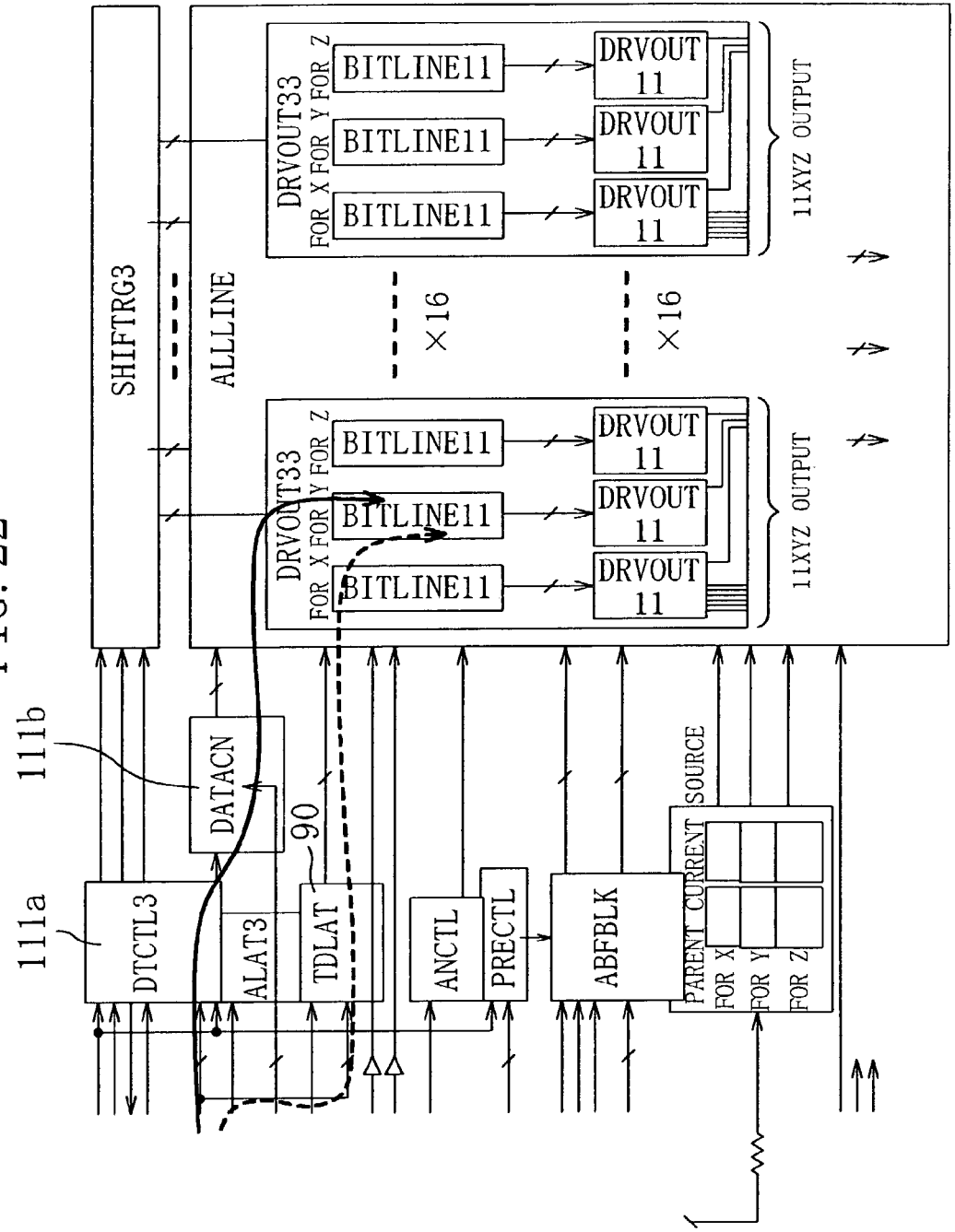
FIG. 22 is a block circuit diagram for showing paths of input signals from the outside in an output circuit for gray scale control.
Figure 25A:
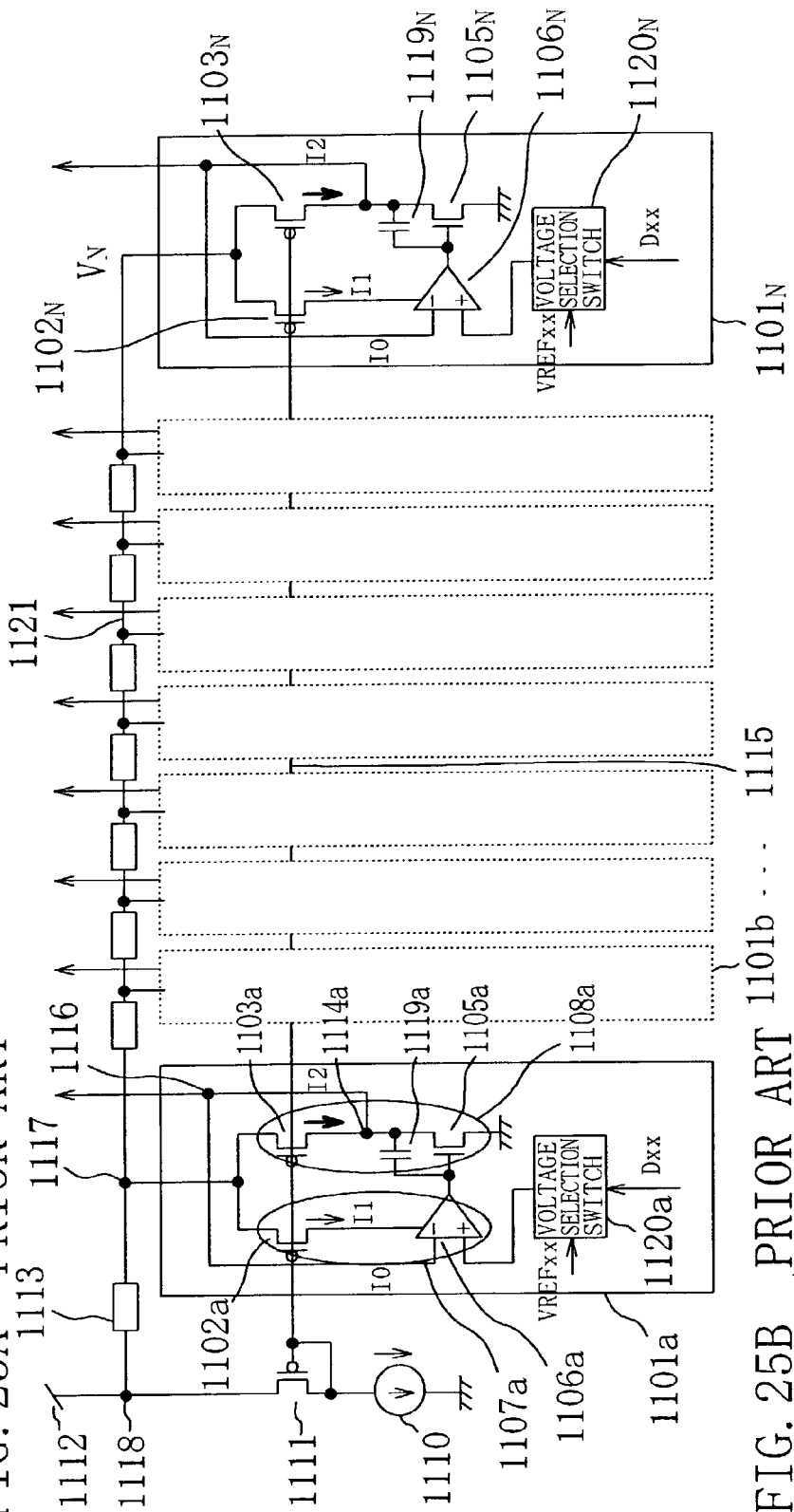
FIGS. 25A and 25B are, respectively, a circuit diagram showing the configuration of a conventional voltage driver and a view showing the relationship between a power-supply potential of a power-supply voltage supply line and the distance from a power-supply voltage supply unit.
Figure 25B:
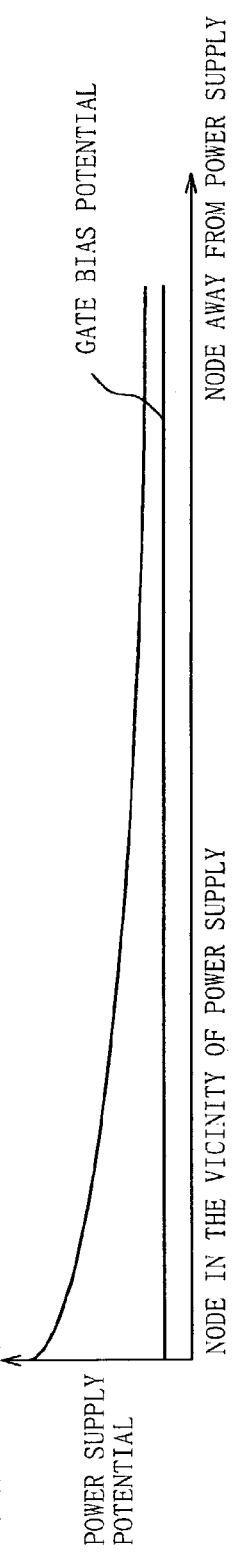
Figure 26A:
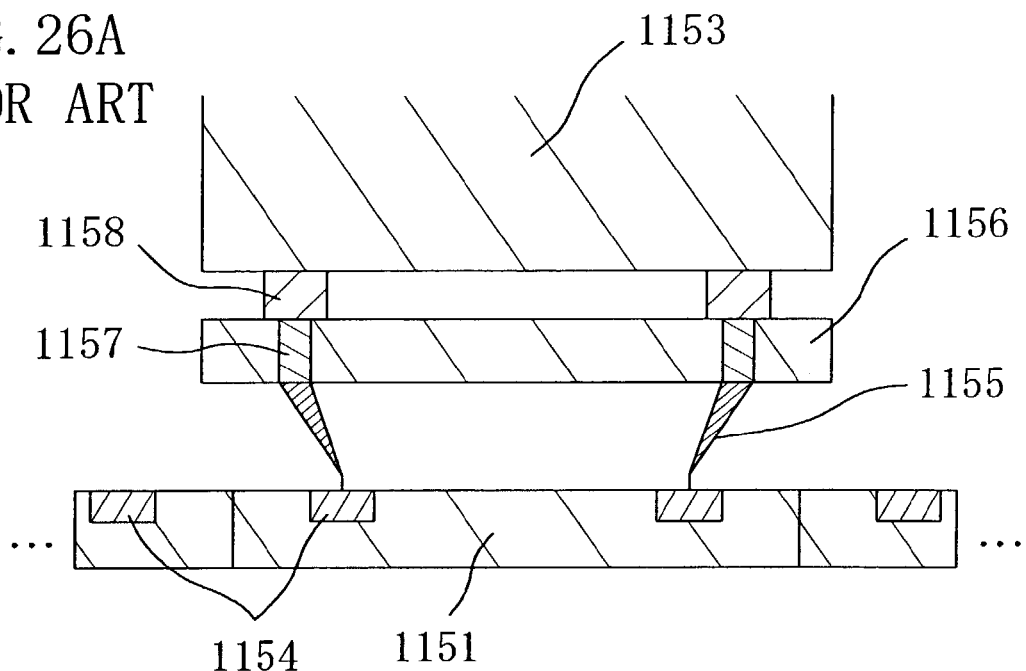
FIGS. 26A and 26B are, respectively, a cross-sectional view showing a conventional probe card for testing a current driving output circuit for gray scale control and a block circuit diagram showing a cross sectional of the conventional probe card.
Figure 26B:
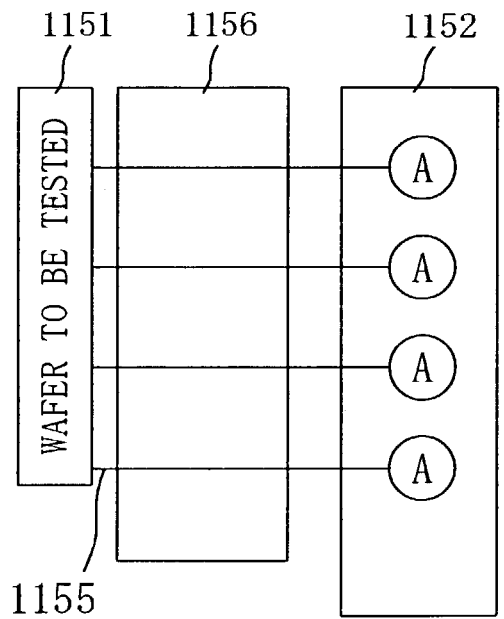

FIG. 22 is a block circuit diagram for showing path of input signals from the outside in an output circuit for gray scale control.

In a case where the output circuit for gray scale control is used as a current driver for a display apparatus, display data is input from a data input terminal, is latched into a plurality of latch circuits, and is then supplied to individual gray scale control circuits. Specifically, the display data input from the outside at the normal time is input to the gray scale control circuit via, for example, normal operating latch circuits 111a and 111b along a path like a black line shown in FIG. 22.

However, when inputting a very small current for testing purposes along the above-described path, it takes a long test time. For example, when an analog current is input to perform a test for variations in gray scale, a huge amount of test time is required.

As such, in order to reduce the test time and to thereby improve the testing efficiency, the present inventors decided that one common latch circuit 90 for all output units existing in the chip into which the gray scale control circuits are integrated is provided to the chip for use only in the testing time.

FIG. 23 is a circuit diagram of a selection circuit in a semiconductor chip according to the fourteenth embodiment of the present invention.

As shown in the figure, the semiconductor chip of the present embodiment includes the output circuits for gray scale control integrated into the semiconductor chip; a normal operating latch circuit 111 provided in units of a bit cell of the output circuit for gray scale control; the common latch circuit 90, which is a single circuit provided to the semiconductor chip; a selection circuit used to connect any one of the normal operating latch circuit 111 and the common latch circuit 90 to bit cells of the output circuit for gray scale control.

A wire extends from the common latch circuit 90 for connection to all the bit cells;

In the normal operation time, the switching circuit is caused to the off-state so that the common latch circuit 90 is not connected to the bit cells.

At the testing time, the selection circuit is set to operate so that the common latch circuit 90 are connected to all the bit cells. In the present embodiment, an output from the common latch circuit 90 is coupled to all 528 outputs of the output circuit for gray scale control.

According to the configuration described above, since data need not be latched every time at the testing time, the test time can be significantly reduced.

What is claimed is:

1. An output circuit for gray scale control, comprising:
   a power-supply voltage supply unit;
   a first current supply unit;
   a first MISFET which is provided between the first current supply unit and the power-supply voltage supply unit and has a gate electrode connected to the power-supply voltage supply unit;
   a plurality of gray scale control units each having an output buffer unit including a first transistor, and a differential circuit including a second transistor which constitutes a current mirror together with the first transistor;
   a bias supply line which is connected to the gate electrode of the first MISFET and controls currents flowing to the first transistor and the second transistor;
   a first power-supply voltage supply wire connected to the power-supply voltage supply unit for supplying a power-supply voltage to the output buffer unit; and
   a second power-supply voltage supply wire connected to the power-supply voltage unit for supplying the power-supply voltage to the differential circuit.

2. The output circuit for gray scale control of claim 1, wherein
   both of the first transistor and the second transistor are MISFETs of the same conductive type, having a gate electrode connected to the bias supply line.

3. The output circuit for gray scale control of claim 1, wherein
   the current flowing through the first transistor at the time of driving is larger than the current flowing through the second transistor.

4. The output circuit for gray scale control of claim 1, wherein
   the gray scale control unit further has a voltage selection switch for supplying a voltage for gray scale control to the output buffer unit.

5. The output circuit for gray scale control of claim 4, wherein
   the differential circuit has an operational amplifier of which an input unit is connected to the voltage selection switch and an output unit is connected to the output buffer unit.

6. The output circuit for gray scale control of claim 1, further comprising:
   a second current supply unit; and
   a MISFET for tilted-bias which is connected to the second current supply unit and the first power-supply voltage supply wire, and is of the same conductive type as the first MISFET, wherein
   the gate electrode of the MISFET for tilted-bias is connected to the first power-supply voltage supply wire and the bias supply line.

7. The output circuit for gray scale control of claim 6, further comprising:
   a second MISFET which is connected to the power-supply voltage supply unit and constitutes a transmission-side current mirror together with the first MISFET, wherein
   the second current supply unit is a reception-side current mirror which is connected to the transmission-side current mirror and is constituted of MISFETs of which conductive types are same as each other.

* * * * *